(12) United States Patent
Kim et al.

(10) Patent No.: US 7,825,413 B2
(45) Date of Patent: Nov. 2, 2010

(54) LIQUID CRYSTAL DISPLAY DEVICE AND METHOD OF FABRICATING THE SAME

(75) Inventors: Hyo-Uk Kim, Gyeongbuk (KR); Byoung-Ho Lim, Gyeongbuk (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/506,872

(22) Filed: Jul. 21, 2009

(65) Prior Publication Data

US 2009/0278129 A1 Nov. 12, 2009

Related U.S. Application Data

(62) Division of application No. 11/642,872, filed on Dec. 21, 2006, now Pat. No. 7,579,201.

(30) Foreign Application Priority Data

May 9, 2006 (KR) ...................... 10-2006-0041600

(51) Int. Cl.
*H01L 29/04* (2006.01)
(52) U.S. Cl. ................... 257/59; 257/72; 257/E21.094; 257/E21.104
(58) Field of Classification Search .................... 257/57, 257/59, 72, 83, 257, 290, E21.094, E21.104, 257/E21.372
See application file for complete search history.

(56) References Cited

U.S. PATENT DOCUMENTS 6,682,961 B1 * 1/2004 Kim ........................... 438/149

FOREIGN PATENT DOCUMENTS

| JP | 62-126677 | 8/1987 |
|---|---|---|
| JP | 02-062051 | 3/1990 |
| JP | 04-299865 | 10/1992 |
| JP | 05-053144 | 3/1993 |
| JP | 06-202135 | 7/1994 |
| JP | 09-127707 | 5/1997 |

* cited by examiner

*Primary Examiner*—Quoc D Hoang
(74) *Attorney, Agent, or Firm*—Morgan, Lewis & Bockius LLP

(57) ABSTRACT

A liquid crystal display device includes a gate line and a data line crossing each other to define a pixel region on a substrate, a gate electrode connected to the gate line, a gate insulating layer on the gate electrode, an active layer on the gate insulating layer, source and drain electrodes on the active layer, spaced apart from each other and each having inner sides that face each other, wherein the source electrode is connected to the data line, ohmic contact layers between the active layer and each of the source and drain electrodes, a shielding pattern over the active layer and having outer sides, wherein at least one of the outer sides faces at least one of the inner sides of the source and drain electrodes, and a pixel electrode in the pixel region and connected to the drain electrode.

14 Claims, 30 Drawing Sheets

LIQUID CRYSTAL DISPLAY DEVICE AND METHOD OF FABRICATING THE SAME

CROSS-REFERENCE TO RELATED APPLICATIONS

This application is a Divisional of application Ser. No. 11/642,872, filed Dec. 21, 2006 now allowed; which claims priority to Korean Patent Application No. 10-2006-0041600, filed May 9, 2006, all of which are hereby incorporated by reference as if fully set forth herein.

This invention claims the benefit of Korean Patent Application No. 2006-0041600, filed in Korea on May 9, 2006, which is hereby incorporated by reference in its entirety.

BACKGROUND OF THE INVENTION

1. Field of the Invention

Embodiments of the invention relate to a liquid crystal display device, and more particularly, to a liquid crystal display (LCD) device and a method of fabricating the same.

2. Discussion of the Related Art

Until recently, display devices have typically used cathode-ray tubes (CRTs). Presently, many efforts are being made to study and develop various types of flat panel displays, such as liquid crystal display (LCD) devices, plasma display panels (PDPs), field emission displays, and electro-luminescence displays (ELDs), as a substitute for CRTs. Of these flat panel displays, the LCD devices have many advantages, such as high resolution, light weight, thin profile, compact size, and low voltage power supply requirements.

In general, an LCD device includes two substrates that are spaced apart and face each other with a liquid crystal material interposed between the two substrates. The two substrates include electrodes that face each other such that a voltage applied between the electrodes induces an electric field across the liquid crystal material. Alignment of the liquid crystal molecules in the liquid crystal material changes in accordance with the intensity of the induced electric field into direction of the induced electric field, thereby changing the light transmissivity of the LCD device. Thus, the LCD device displays images by varying the intensity of the induced electric field.

FIG. 1 is a perspective view illustrating an LCD device according to the related art. Referring to FIG. 1, the LCD device 51 includes an array substrate, a color filter substrate and a liquid crystal layer between the two substrates. The color filter substrate includes a black matrix 6, and red (R), green (G) and blue (B) color filter patterns 7a, 7b and 7c on a second substrate 5. A common electrode 9 is disposed on the color filter patterns 7a, 7b and 7c. The array substrate includes a gate line 14 and a data line 26 crossing each other on a first substrate 10 to define a pixel region P. A thin film transistor T is disposed near a crossing portion of the gate and data lines 14 and 26. A pixel electrode 32 is disposed in the pixel region P and connected to the thin film transistor T.

The array substrate is fabricated with five mask processes. A gate electrode and the gate line are formed in a first mask process. A semiconductor layer is formed in a second mask process. A data line, a source electrode and a drain electrode are formed in a third mask process. A passivation layer having a contact hole exposing the drain electrode is formed in a fourth mask process. A pixel electrode is formed in a fifth mask process.

Because the array substrate is fabricated with the five mask processes, fabrication time is long and product cost is high. To resolve these problems, a method of fabricating an array substrate with four mask processes has been suggested. One less mask process reduces both fabrication time and product cost.

FIG. 2 is a plan view illustrating an array substrate for an LCD device fabricated with four mask processes according to the related art. Referring to FIG. 2, a gate line 62 and a data line 98 cross each other on a substrate to define a pixel region. A gate pad electrode 64 is disposed at one end of the gate line 62, and a data pad electrode 100 is disposed at one end of the data line 98. A gate pad electrode terminal 114 is disposed on the gate pad electrode 64, and a data pad electrode terminal 116 is disposed on the data pad electrode 100.

A thin film transistor T is disposed near a crossing of the gate and data lines 62 and 98. The thin film transistor T includes a gate electrode 64, a first semiconductor layer 90a, and source and drain electrodes 94 and 96. A pixel electrode 112 is disposed in the pixel region and contacts the drain electrode 96.

A storage electrode 86 overlaps the gate line 62. The storage electrode 86, the gate line 62 and a gate insulating layer therebetween form a storage capacitor Cst. A second semiconductor layer 90b is disposed below the data line 98, and a third semiconductor layer 90c is disposed below the storage electrode 86.

Because metal patterns, such as the data line 98, the storage electrode 86 and the source and drain electrodes 94 and 96, and the semiconductor patterns, such as the first to third semiconductor layers 90a to 90c are formed in the same mask process, the semiconductor patterns are disposed below the metal pattern. A part of the first semiconductor layer 90a extends outside of the gate electrode 64. The extended part of the first semiconductor layer 90a is exposed to a backlight and activated.

FIG. 3 is a cross-sectional view illustrating a thin film transistor of FIG. 2. Referring to FIG. 3, a first semiconductor layer 90a includes an active layer 92a and an ohmic contact layer 92b of amorphous silicon. Because the first semiconductor layer 90a is formed along with source and drain electrodes 94 and 96, the first semiconductor layer 90a has substantially the same outline as the source and drain electrodes 94 and 96. Accordingly, a part of the first semiconductor layer 90a extends outside a gate electrode 62. The extended part of the first semiconductor layer 90a is exposed to a backlight, and thus a leakage current can occur. The leakage current causes a voltage charged in a pixel region to abnormally leak through the thin film transistor T. Accordingly, characteristics of the thin film transistor T are degraded. This is a problem in the four mask processes according to the related art.

When amorphous silicon is used for the semiconductor layer, an inverted staggered type thin film transistor like the thin film transistor of FIG. 3 is formed. In the inverted staggered type thin film transistor T, a channel CH of the thin film transistor T is exposed to an exterior circumstance before forming a passivation layer 100. Accordingly, the channel CH may have defect or contamination during the subsequent processes. These are other problems of the four mask processes according to the related art. Such a defect or contamination can also cause leakage current in the thin film transistor.

FIGS. 4A to 4F, 5A to 5F and 6A to 6F are cross-sectional views, taken along lines II-II, III-III and IV-IV of FIG. 2, illustrating a method of fabricating an array substrate for an LCD device with four mask processes according to the related art. Referring to FIGS. 4A, 5A and 6A, a metallic material is deposited on a substrate 60 having a pixel region P, a switching region S, a gate region G, a data region D and a storage region C. The metallic material layer is patterned with a first mask process to form a gate line 62, a gate pad electrode 66 and a gate electrode 64.

Referring to FIGS. 4B, 5B and 6B, a gate insulating layer 68, an intrinsic amorphous silicon layer 70, an impurity-doped amorphous silicon layer 72 and a metallic material layer 74 are formed on the substrate 60 having the gate line 62. A photoresist layer is formed on the metallic material layer 74. The photoresist layer is patterned with a second mask to form first to third photoresist patterns 78a to 78c in the switching region S, the data region D and the storage region S. A portion of the first photoresist pattern 78a corresponding to the gate electrode 64 has a thinner thickness than other portions. The metallic material layer 74, the impurity-doped amorphous silicon layer 72 and the intrinsic amorphous silicon layer 70 are patterned with the first to third photoresist patterns 78a to 78c.

Referring to FIGS. 4C, 5C and 6C, first to third metal patterns 80, 82 and 86 are formed below the first to third photoresist patterns 78a to 78c. First to third semiconductor layers 90a to 90c are formed below the first to third metal patterns 80, 82 and 86. An ashing process is performed on the first to third photoresist patterns 78a to 78c to remove the thinner portion of the first photoresist pattern 78a. As a result of the ashing process, the sides of the first to third photoresist patterns 78a to 78c are also removed. The first to third metal patterns 80, 82 and 86 and the impurity-doped amorphous silicon layers 72 of the first to third semiconductor layers 90a to 90c are patterned with the ashed first to third photoresist patterns 78a to 78c.

Referring to FIGS. 4D, 5D and 6D, source and drain electrodes 94 and 96, a data line 98 and a data pad electrode 100 are formed. The third metal pattern 86 is referred to as a storage electrode 86. The impurity-doped amorphous silicon layer 72 of the first semiconductor layer 90a is referred to as an ohmic contact layer 92b, and the intrinsic amorphous silicon layer 70 of the first semiconductor layer 90a is referred to as an active layer 92a. The storage electrode 86 forms a storage capacitor Cst with the gate line 62.

Referring to FIGS. 4E, 5E, and 6E, a passivation layer 102 is formed on the substrate 60 having the data line 98. The passivation layer 102 is patterned with a third mask process to form a drain contact hole 104 exposing the drain electrode 96, a storage contact hole 106 exposing the storage electrode 86, and a data pad contact hole 110 exposing the data pad electrode 100. Also, the passivation layer 102 and the gate insulating layer 68 are patterned with the third mask process to form a gate pad contact hole 108 exposing the gate pad electrode 66.

Referring to FIGS. 4F, 5F and 6F, a transparent conductive material is deposited on the passivation layer 102 and patterned with a fourth mask process to form a pixel electrode 112, a gate pad electrode terminal 114 and a data pad electrode terminal 116. The pixel electrode 112 contacts the drain electrode 96 through the drain contact hole 104 and the storage electrode 86 through the storage contact hole 106. The gate pad electrode terminal 114 contacts the gate pad electrode 66 through the gate pad contact hole 108, and the data pad electrode terminal 116 contacts the data pad electrode 100 through the data pad contact hole 110.

Through the above four mask processes, the array substrate is fabricated. As explained above, the channel of the active layer may be contaminated or have defect because the passivation layer is formed after the formation of the channel. Also, the active layer is not within an area defined by the gate electrode and exposed to a backlight because the active layer is formed in the same mask process as the source and drain electrodes. Accordingly, a leakage current may occur that degrades display quality. Further, the thin film transistor occupies a part of the pixel region, and thus aperture ratio is reduced.

SUMMARY OF THE INVENTION

Accordingly, embodiments of the invention are directed to a liquid crystal display device and a method of fabricating the same that substantially obviates one or more of problems due to limitations and disadvantages of the related art.

An object of the invention is to provide a liquid crystal display device and a method of fabricating the same that prevents a leakage current.

Another object of the invention is to provide a liquid crystal display device and a method of fabricating the same that improves aperture ratio Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, a liquid crystal display device includes a gate line and a data line crossing each other to define a pixel region on a substrate, a gate electrode connected to the gate line, a gate insulating layer on the gate electrode, an active layer on the gate insulating layer, source and drain electrodes on the active layer, spaced apart from each other and each having inner sides that face each other, wherein the source electrode is connected to the data line, ohmic contact layers between the active layer and each of the source and drain electrodes, a shielding pattern over the active layer and having outer sides, wherein at least one of the outer sides faces at least one of the inner sides of the source and drain electrodes, and a pixel electrode in the pixel region and connected to the drain electrode.

In another aspect, a method of fabricating a liquid crystal display device includes forming a gate line and a gate electrode on a substrate, forming a gate insulating layer on the gate electrode, forming an active layer on the gate insulating layer and a shielding pattern with outer sides on the active layer, forming a data line crossing the gate line to define a pixel region, forming source and drain electrodes spaced apart from each other and having inner sides, forming ohmic contact layers between the active layer and each of the source and drain electrodes, wherein at least one of the outer sides faces at least one of the inner sides of the source and drain electrodes, and forming a pixel electrode in the pixel region and connected to the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the illustrated embodiments of the invention, which are illustrated in the accompanying drawings.

Figure 1:
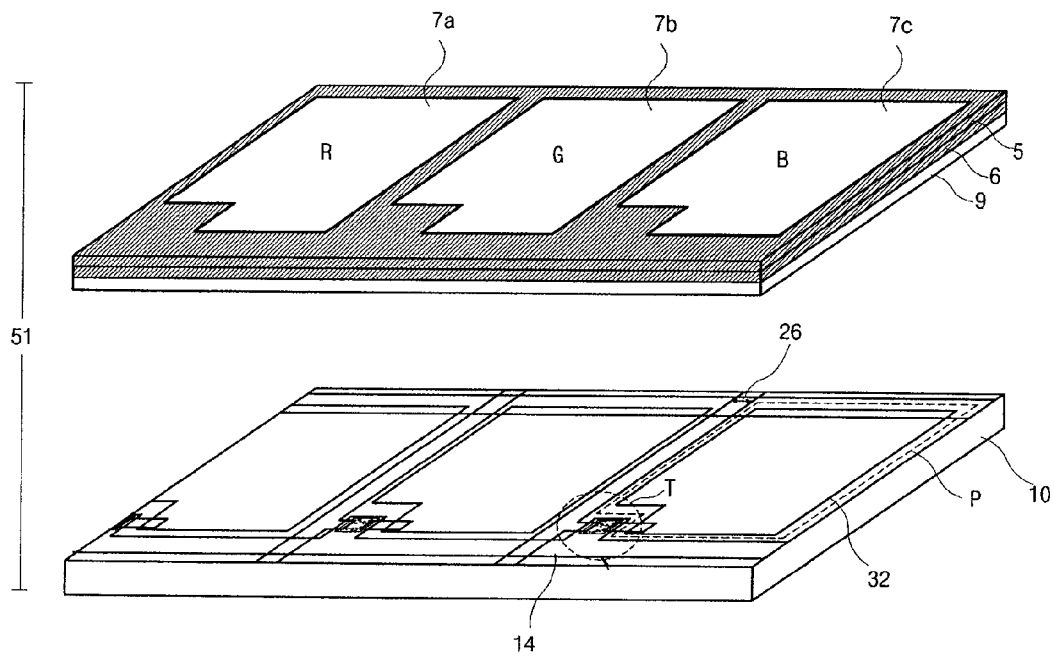
FIG. 1 is a perspective view illustrating an LCD device according to the related art.
Figure 2:
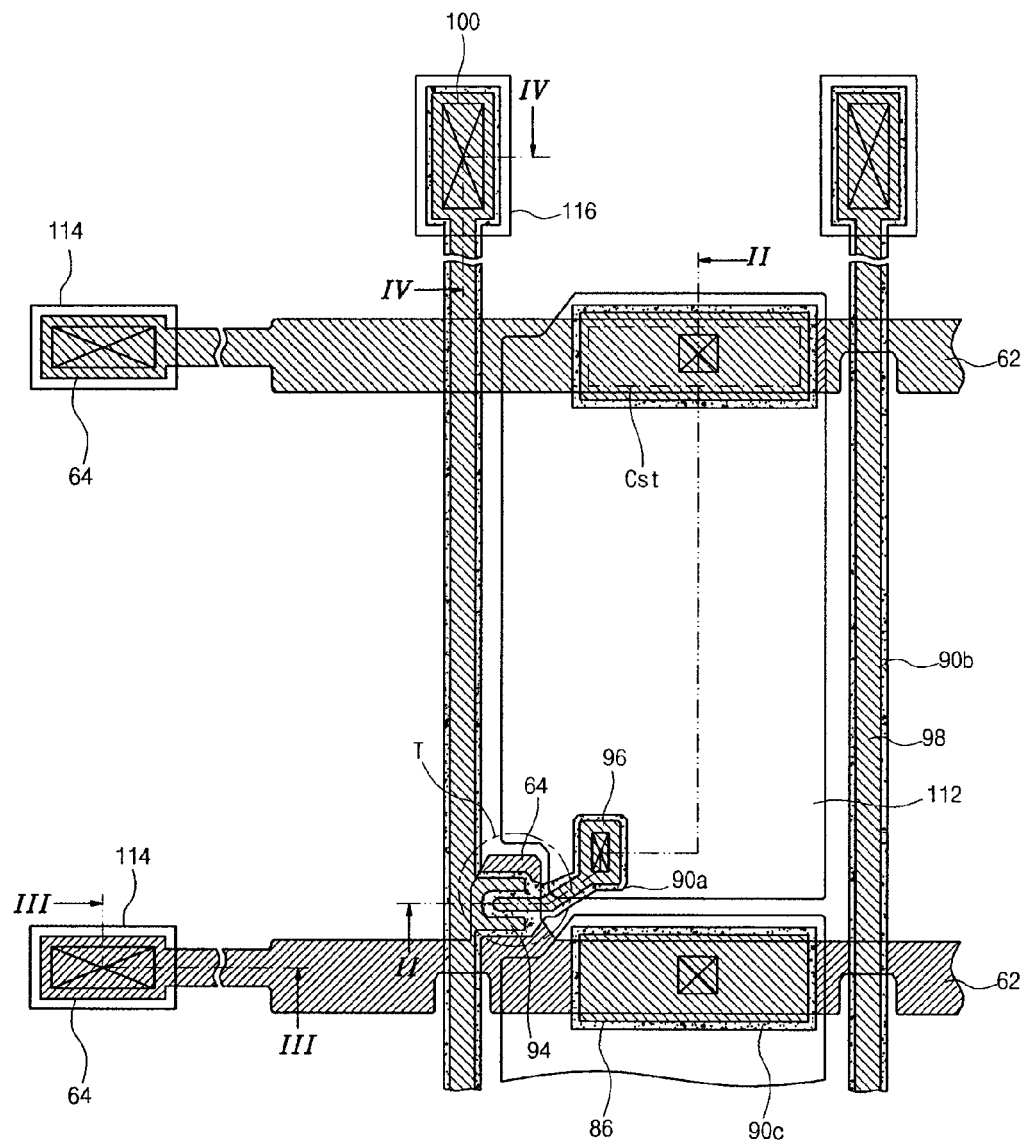
FIG. 2 is a plan view illustrating an array substrate for an LCD device fabricated with four mask processes according to the related art.
Figure 3:
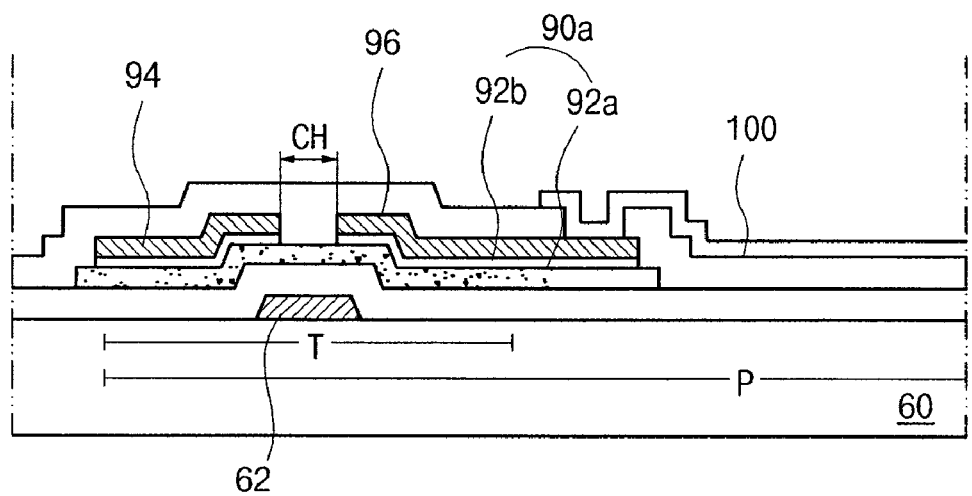
FIG. 3 is a cross-sectional view illustrating a thin film transistor of FIG. 2.
Figure 4A:
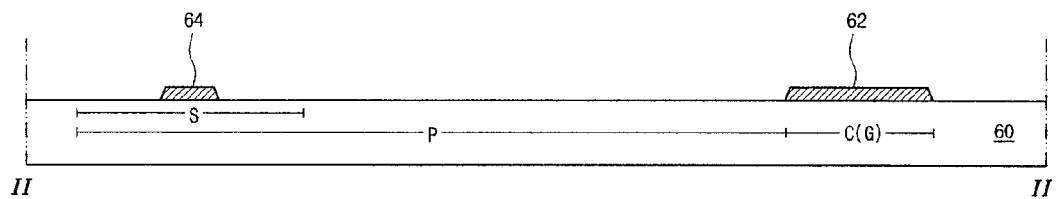
FIGS. 4A to 4F, 5A to 5F and 6A to 6F are cross-sectional views, respectively, taken along lines II-II, III-III and IV-IV of FIG. 2, illustrating a method of fabricating an array substrate for an LCD device with four mask processes according to the related art.
Figure 4B:
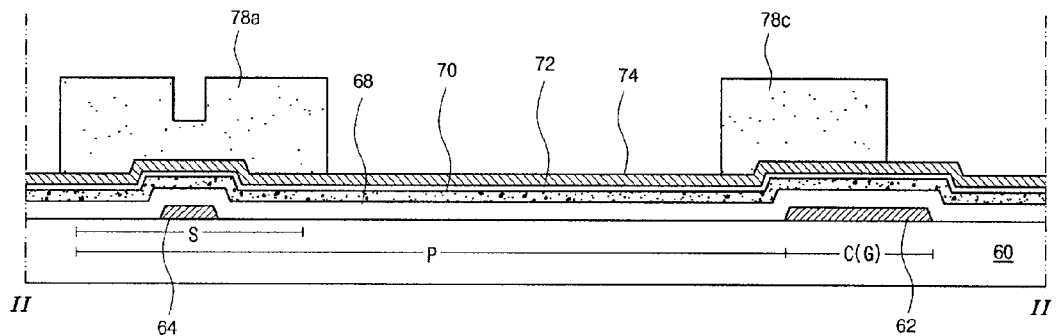
Figure 4C:
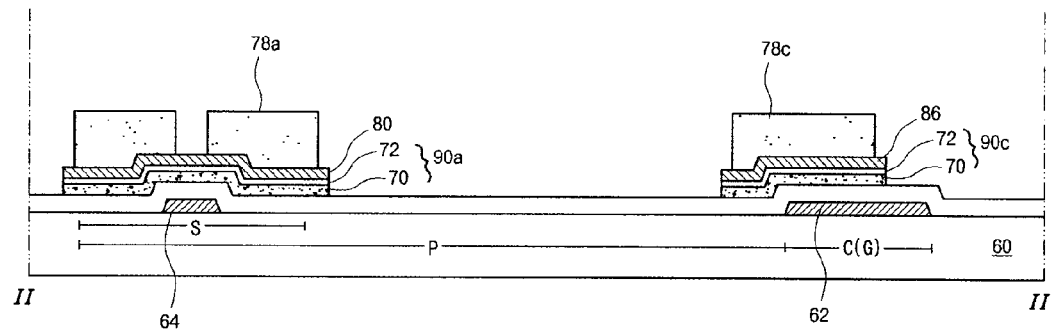
Figure 4D:
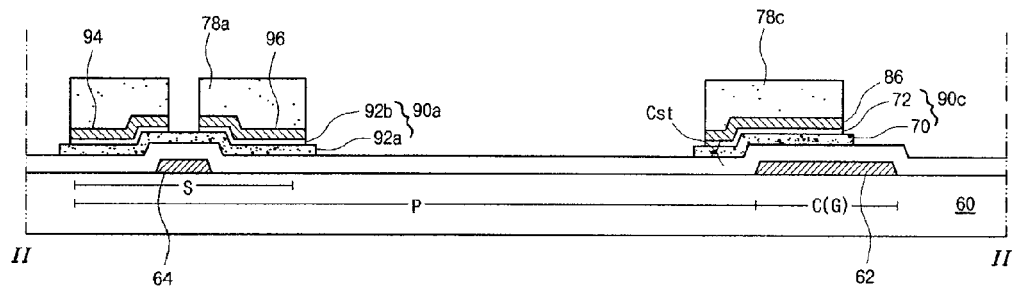
Figure 4E:
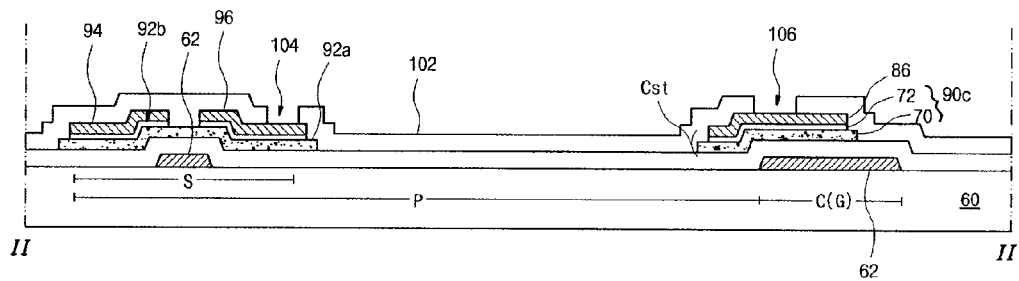
Figure 4F:
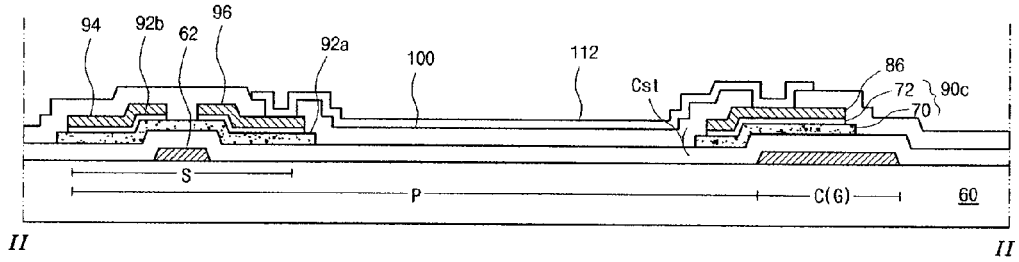
Figure 5A:
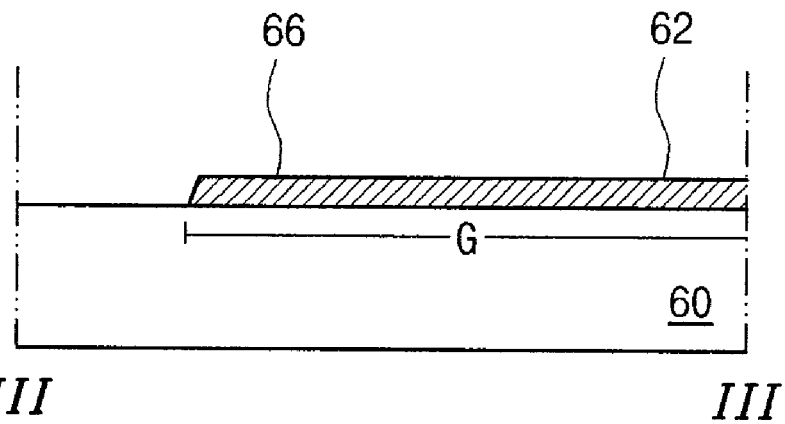
Figure 5B:
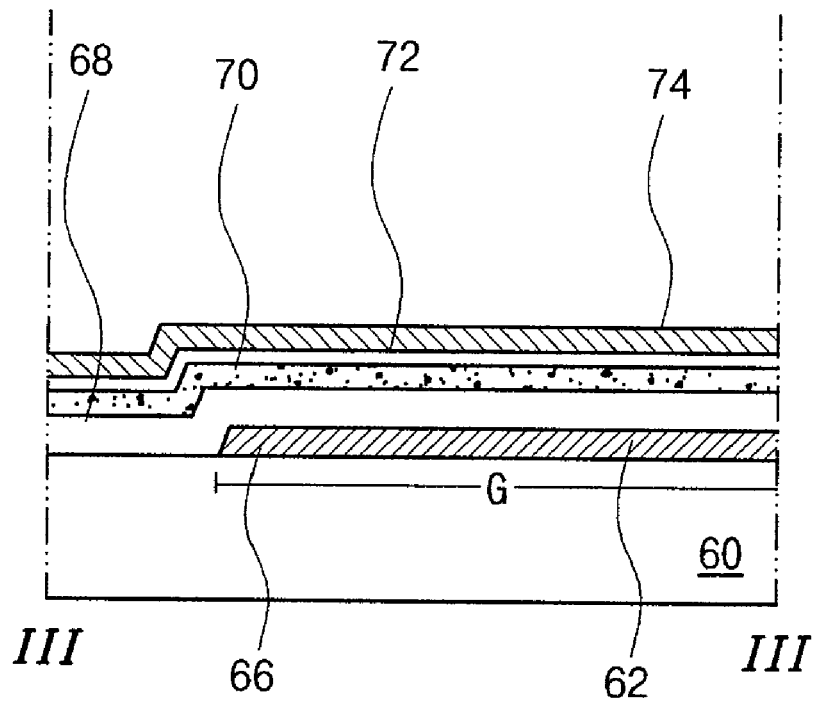
Figure 5C:
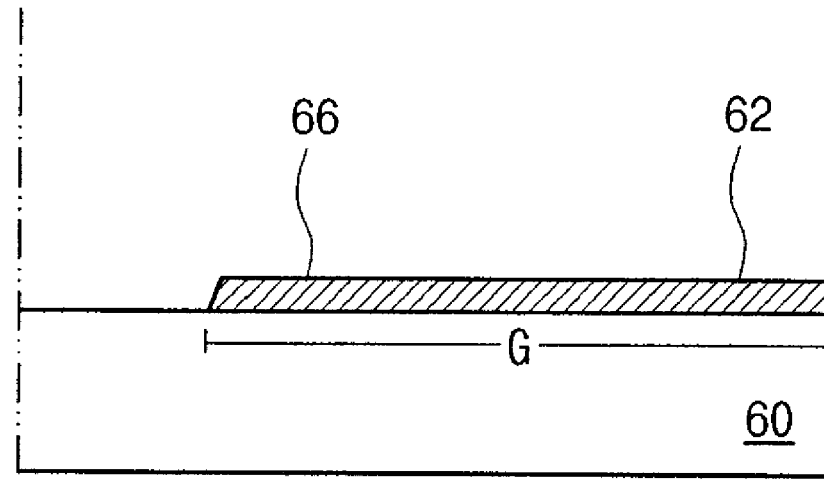
Figure 5D:
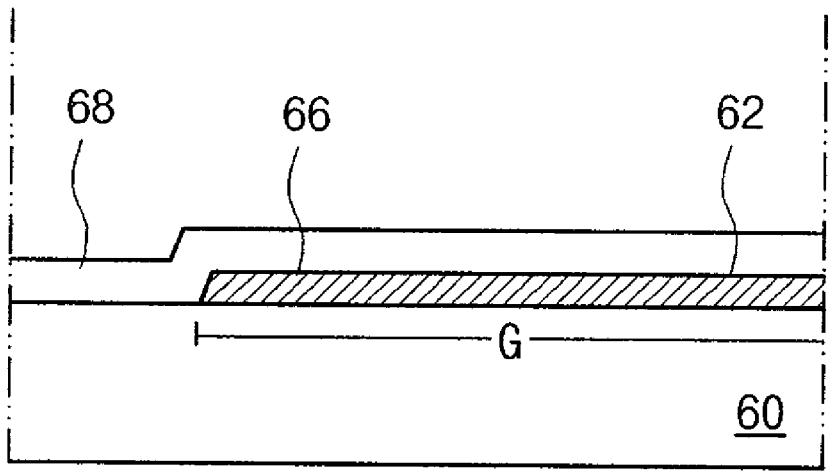
Figure 5E:
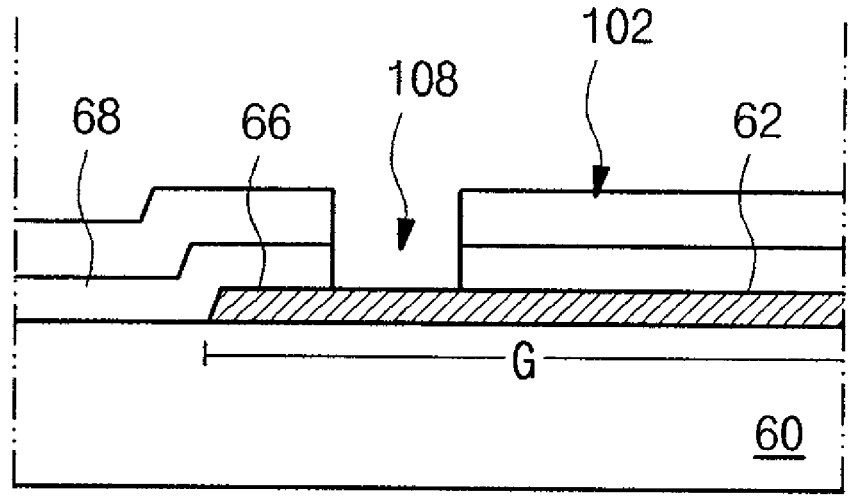
Figure 5F:
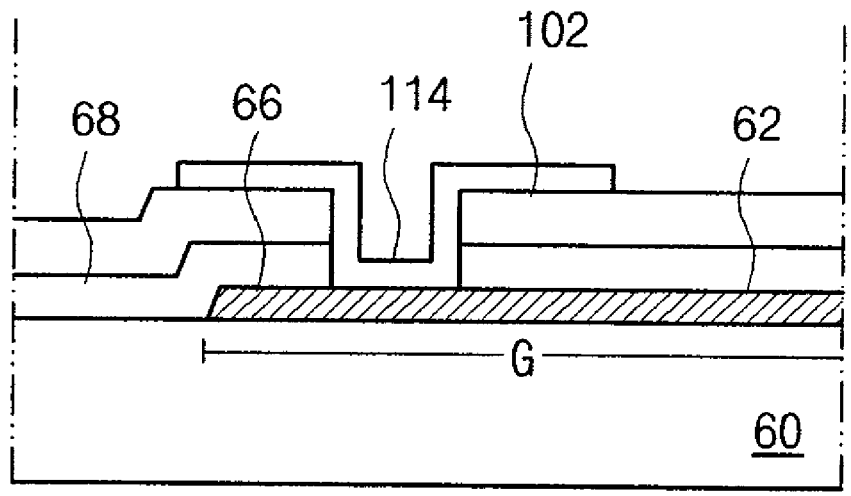
Figure 6A:
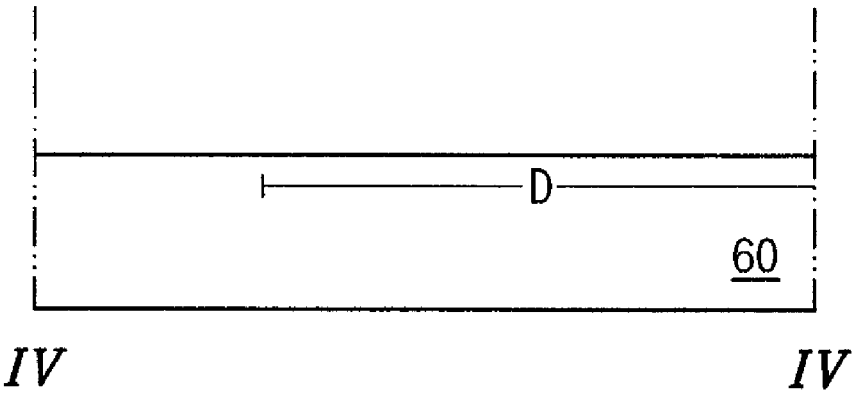
Figure 6B:
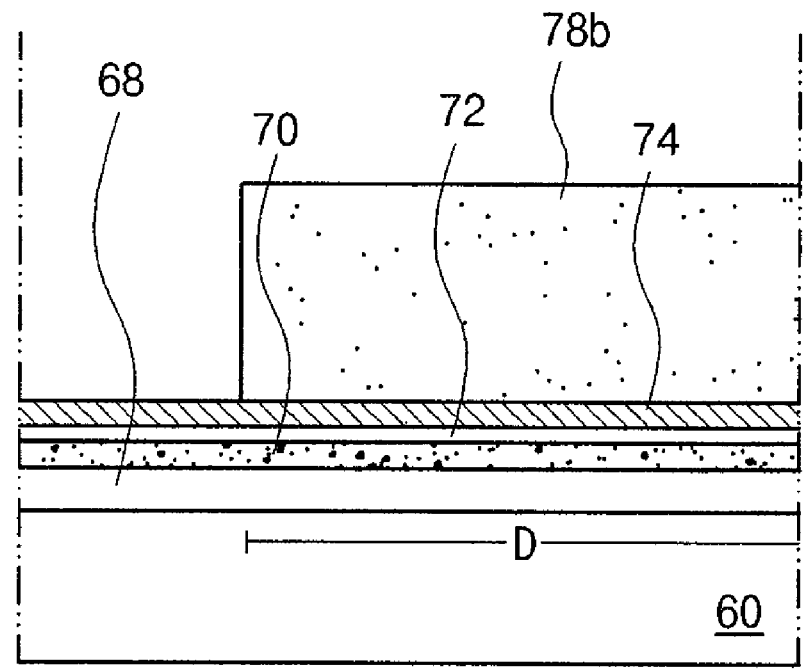
Figure 6C:
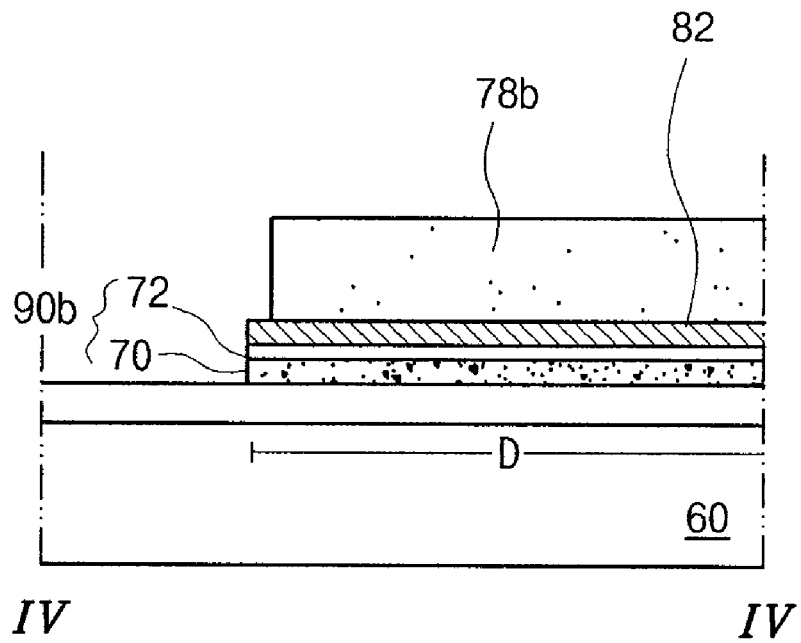
Figure 6D:
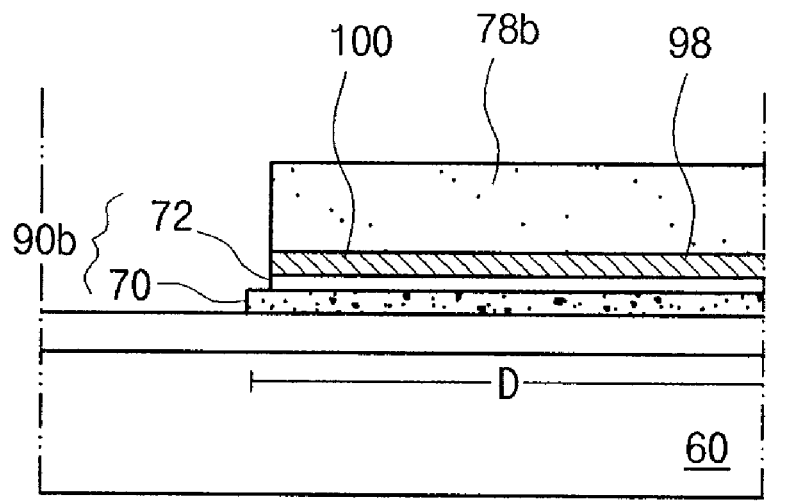
Figure 6E:
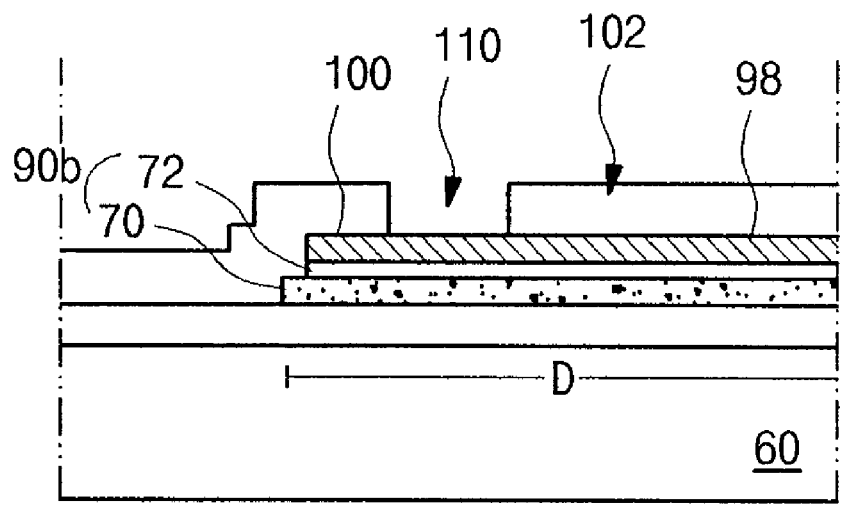
Figure 6F:
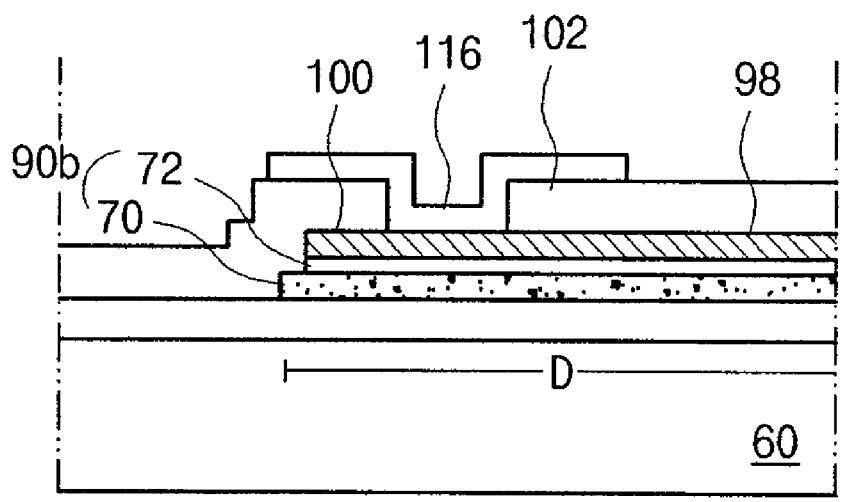
Figure 7:
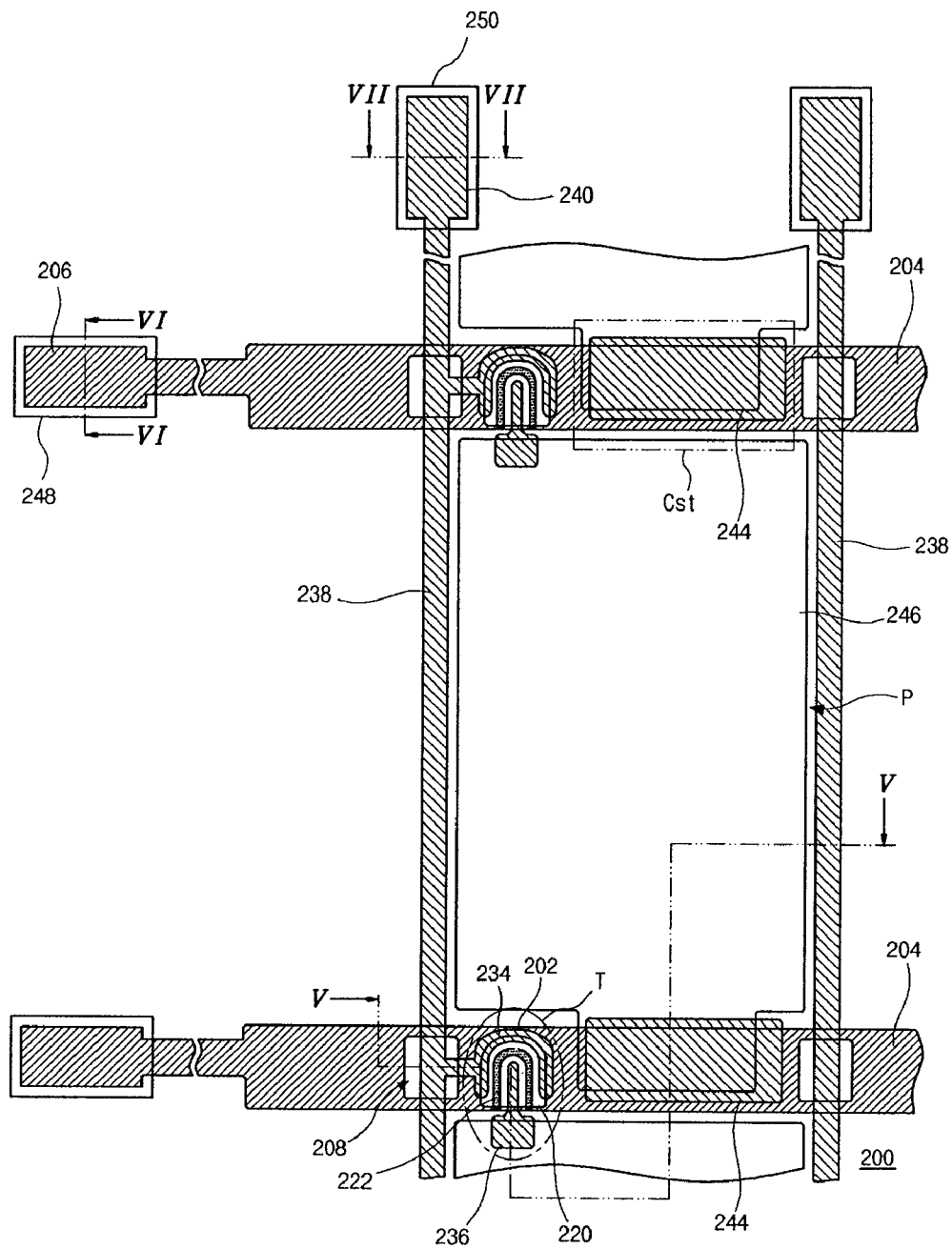
FIG. 7 is a plan view illustrating an array substrate for an LCD device according to an embodiment of the invention.

FIG. 7 is a plan view illustrating an array substrate for an LCD device according to an embodiment of the invention. Referring to FIG. 7, in the array substrate for the LCD device according to the embodiment of the invention, a gate line 204 and a data line 238 cross each other on a substrate 200 to define a pixel region P. A gate pad electrode 206 is disposed at one end of the gate line 204, and a data pad electrode 240 is disposed at one end of the data line 238. A gate pad electrode terminal 248 is disposed on the gate pad electrode 206, and a data pad electrode terminal 250 is disposed on the data pad electrode 240. The gate line 204 has a hole 208 where the gate line 204 and the data line 238 cross each other. The hole 208 reduces the size of the overlap area between the gate and data lines 204 and 238. Accordingly, a parasitic capacitance between the gate and data lines 204 and 238 can be reduced.

A thin film transistor T is disposed near a crossing of the gate and data lines 204 and 238. The thin film transistor T includes a gate electrode 202, a semiconductor layer having an active layer 220 and an ohmic contact layer, and source and drain electrodes 234 and 236. A part of the gate line 204 may act as the gate electrode 202, and the thin film transistor T may be formed substantially within the gate line 204. Accordingly, an occupied area of the thin film transistor T within the pixel region P can be reduced such that the aperture ratio of the pixel region P can be increased.

A pixel electrode 246 is disposed in the pixel region P and contacts the drain electrode 236. A storage electrode 244 contacts the pixel electrode 246 and overlaps the gate line 204. The storage electrode 244, the gate line 62 and a gate insulating layer therebetween form a storage capacitor Cst.

A first semiconductor pattern is disposed below the data line 238 and the data pad electrode 240, and a second semiconductor pattern is disposed below the storage electrode 242. The first and second semiconductor patterns are made of the same material as the ohmic contact layer.

The active layer 220 is disposed in an outline of the gate line 204, and thus the active layer 220 is not exposed to a backlight. Accordingly, leakage current due to backlight exposure can be reduced. The active layer 220 between the source and drain electrodes 234 and 236 acts as a channel. A length direction of the channel is a direction extending between the source and drain electrodes 234 and 236, and a width direction of the channel is a direction crossing the length direction of the channel.

A shielding pattern 222 is disposed on the active layer 220 along a width direction of the channel. The shielding pattern 222 prevents the active layer 220 therebelow from contamination or defect. Accordingly, leakage current path along a length direction of the channel is prevented by the shielding pattern 222 along a width direction of the channel.

Figure 8:
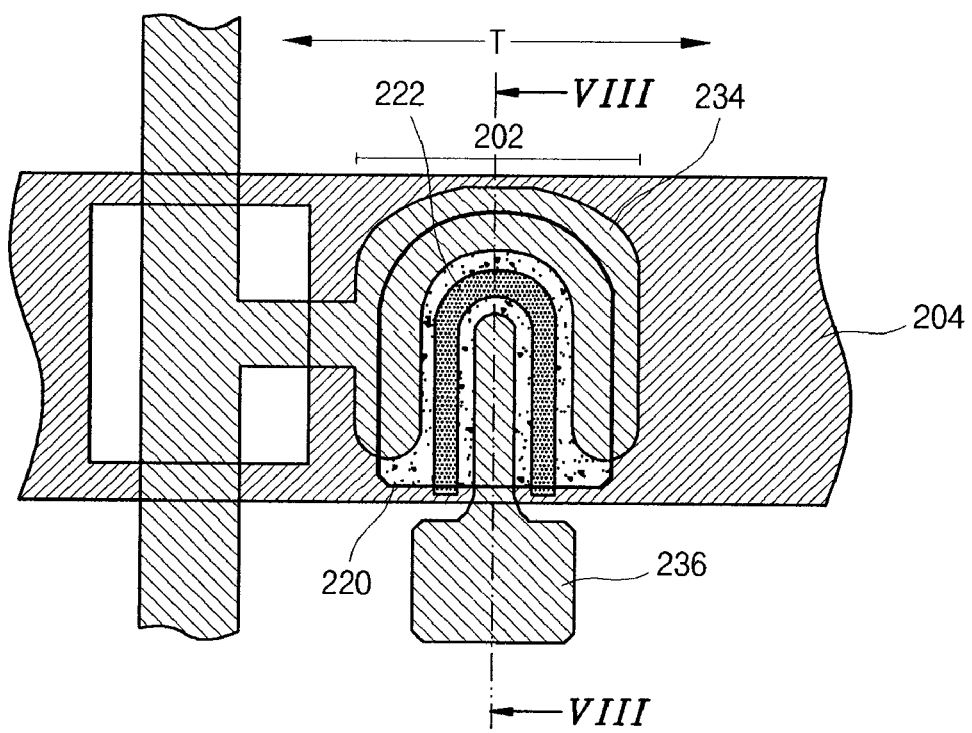
FIG. 8 is a plan view illustrating a thin film transistor of FIG. 6.
Figure 9:
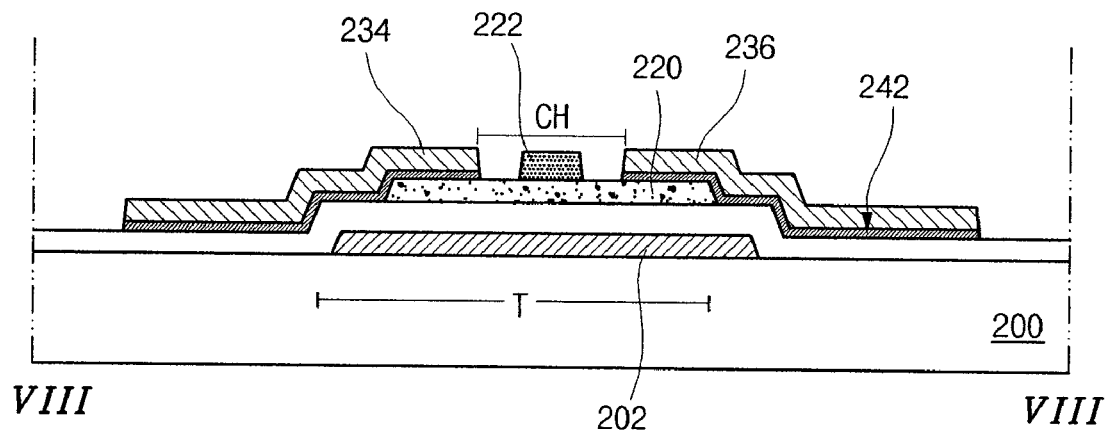
FIG. 9 is a cross-sectional view taken along line VIII-VIII of FIG. 8.

FIG. 8 is a plan view illustrating a thin film transistor of FIG. 6, and FIG. 9 is a cross-sectional view taken along line VIII-VIII of FIG. 8. Referring to FIGS. 8 and 9, a thin film transistor T includes a gate electrode 202 as a part of a gate line 204, a semiconductor layer having an active layer 220 and an ohmic contact layer 242, and source and drain electrodes 234 and 236. Because the active layer 220 is within an area defined by the gate electrode 202, the active layer 220 is not exposed to a backlight.

A shielding pattern 222 is disposed on a channel CH of the active layer 220 between the source and drain electrodes 234 and 236. The shielding pattern 222 extends along a width direction of the channel CH. Both ends of the shielding pattern 222 may be disposed outside the active layer 220, and the shielding pattern 222 may have a length equal to or more than the width of the channel CH. An outer side of the shielding pattern 222 faces and is spaced apart from an inner side of the source electrode 234, and the other outer side of the shielding pattern 222 faces and is spaced apart from an inner side of the drain electrode 236. Accordingly, the shielding pattern 222 may be disposed over all current paths of the active layer 220 between the source and drain electrodes 234 and 236.

Even when contaminations or defects proceed toward the active layer 220, a portion of the active layer 220 below the shielding pattern 222 is shielded from contamination or defect. Further, the shielding pattern 222 is disposed over all current paths of the active layer 220 between the source and drain electrodes 234 and 236. Accordingly, leakage current paths, which would be made if there were no shielding pattern 222, do not occur in the portion of the active layer 220 below the shielding pattern 222.

The width/length (W/L) ratio of the channel CH has an effect on electrical characteristics of the thin film transistor T. For example, as the width/length ratio of the channel CH increases, the current carrying capacity of the thin film transistor T also increases. To increase the width/length ratio of the channel CH, the source electrode 234 can have a "U" shape and the drain electrode 236 can have a bar shape, which is disposed in an inner space of the "U" shape. Due to the shapes and arrangement of the source and drain electrodes 234 and 236, the channel CH can have a "U", and the shielding pattern 222 can also have a "U" shape.

The shielding pattern 222 of FIG. 8 is disposed between the source and drain electrodes 234 and 236 to prevent leakage current paths. The shielding pattern 222 may be disposed at other positions different from the position shown in FIG. 8, and there can be more than one shielding pattern 222.

Figure 10:
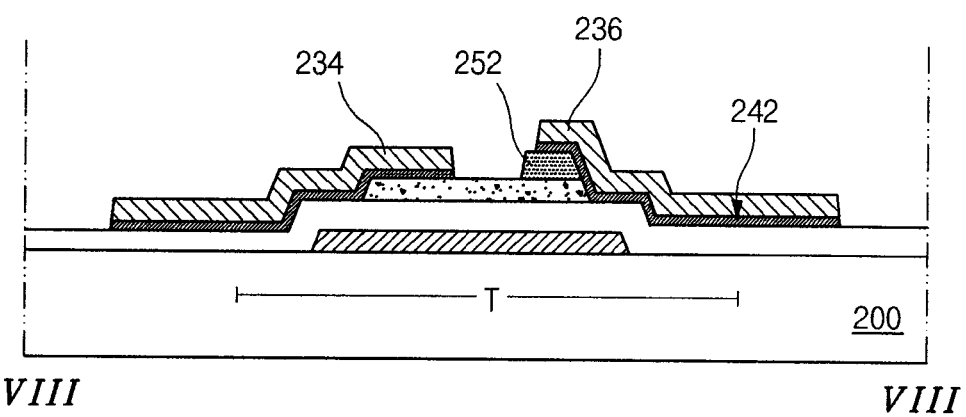
FIGS. 10 and 11 are cross-sectional views illustrating other examples of shielding patterns according to embodiments of the invention.
Figure 11:
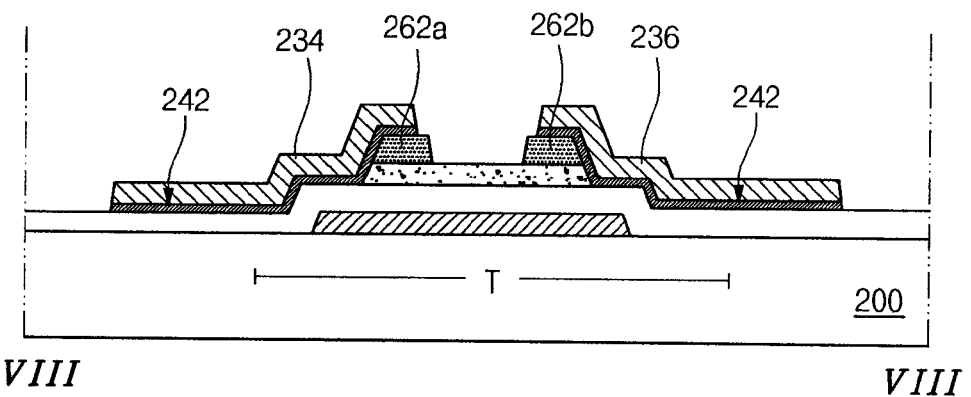

FIGS. 10 and 11 are cross-sectional views illustrating other examples of shielding patterns according to embodiments of the invention. Referring to FIG. 10, a shielding pattern 252 may be disposed near one of source and drain electrodes 234 and 236, for example, near the drain electrode 236. The shielding pattern 252 is partially covered by the drain electrode 236 and an ohmic contact layer 242 below the drain electrode 236. One outer side of the shielding pattern 252 facing the source electrode 234 is disposed between inner sides of the source and drain electrodes 234 and 236. Accordingly, the shielding pattern 252 of FIG. 10 is also disposed over current paths of an active layer 220 between the source and drain electrodes 234 and 236.

Referring to FIG. 11, two shielding patterns 262a and 262b may be disposed near both source and drain electrodes 234 and 236. Each of the shielding patterns 262a and 262b is partially covered by each of the source and drain electrodes 234 and 236, and ohmic contact layers 242 below each of the source and drain electrodes 234 and 236. One outer side of the shielding pattern 262b near the drain electrode 236, which faces the source electrode 234, is disposed between inner sides of the source and drain electrodes 234 and 236. Also, one outer side of the shielding pattern 262a near the source electrode 234, which faces the drain electrode 236, is disposed between the inner sides of the source and drain electrode 234 and 236. Accordingly, the shielding patterns 262a and 262b of FIG. 11 are also disposed over current paths of an active layer 220 between the source and drain electrodes 234 and 236 to prevent leakage currents due to contamination and defect.

Figure 12A:
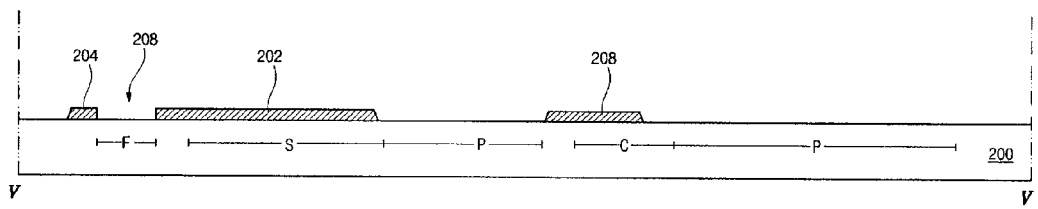
FIGS. 12A to 12L, 13A to 13L and 14A to 14L are cross-sectional views, respectively taken along lines V-V, VI-VI and VII-VII of FIG. 7, illustrating a method of fabricating an array substrate for an LCD device according to an embodiment of the invention.

FIGS. 12A to 12L, 13A to 13L and 14A to 14L are cross-sectional views, respectively taken along lines V-V, VI-VI and VII-VII of FIG. 7, illustrating a method of fabricating an array substrate for an LCD device according to an embodiment of the invention. Referring to FIGS. 12A, 13A and 14A, a conductive material is deposited on a substrate 200 having a pixel region P, a switching region S, a gate region G, a data region D and a storage region C. The conductive material layer is patterned with a first mask process to form a gate line 204, a gate pad electrode 206 and a gate electrode 202. The gate line 204 and the gate pad electrode 206 correspond to the gate region G. Further, a hole 208 is formed in a crossing region F with the first mask process. The crossing region F is where the gate line 204 crosses a data line that will be formed later. The conductive material includes aluminum (Al), aluminum alloy (AlNd), tungsten (W), chromium (Cr) and molybdenum (Mo). At least one of the conductive materials may be deposited for the gate line 204, the gate pad electrode 206 and the gate electrode 202 to have single or multiple-layered structure.

Figure 12B:
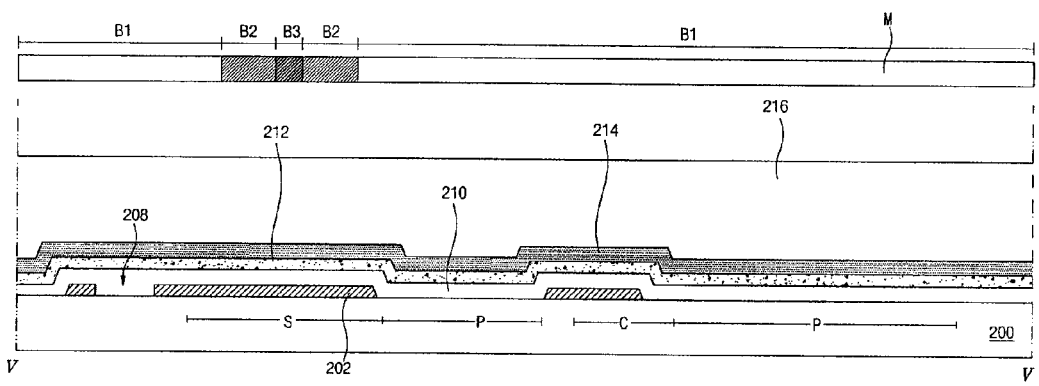
Figure 13A:
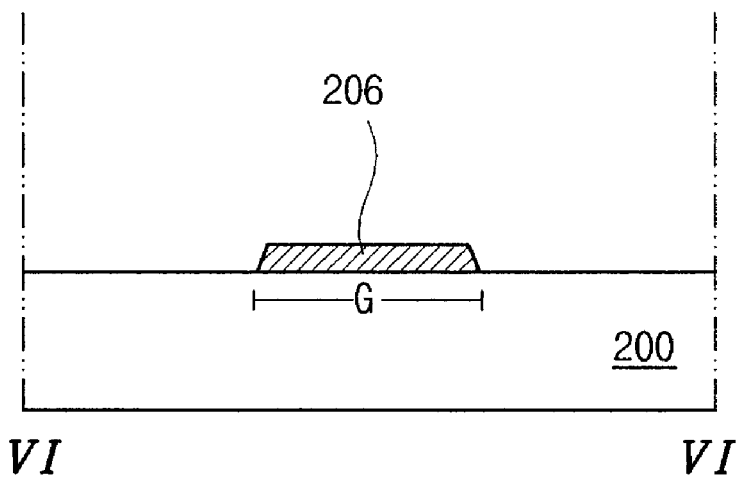
Figure 13B:
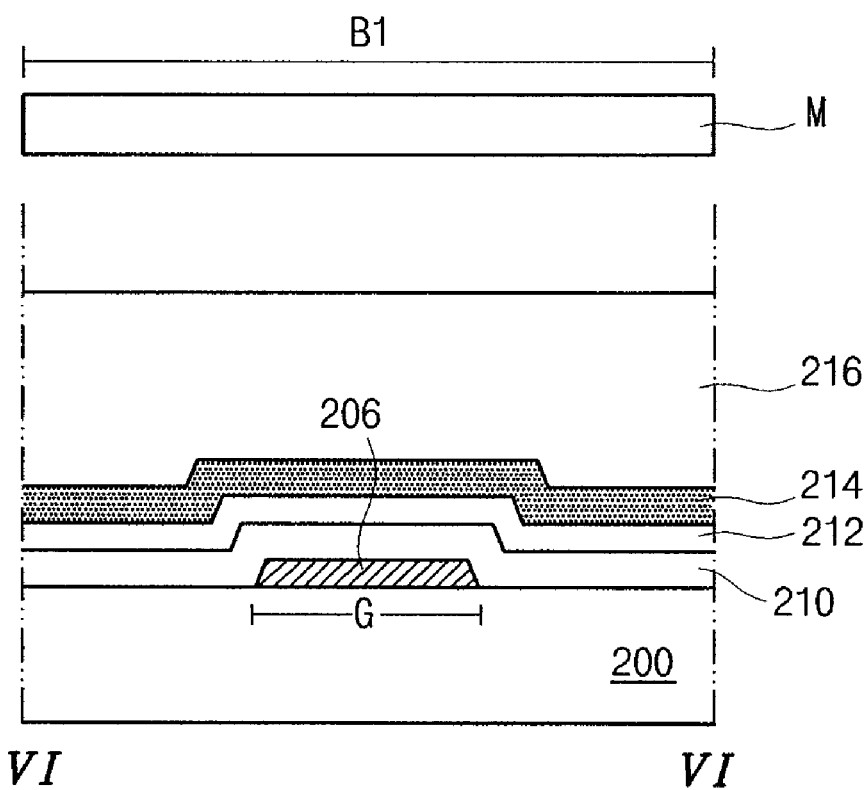
Figure 14A:
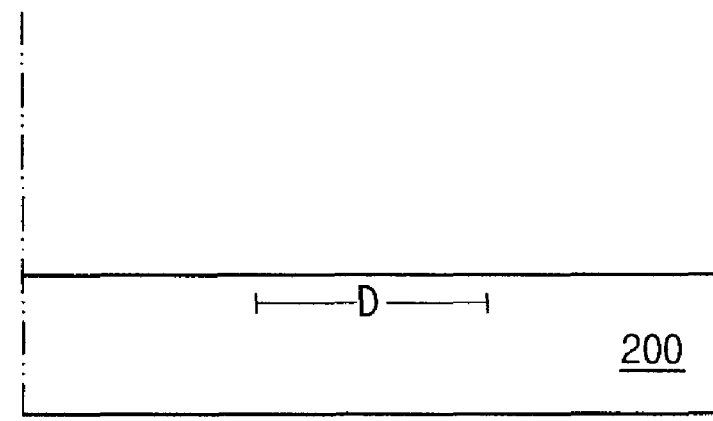
Figure 14B:
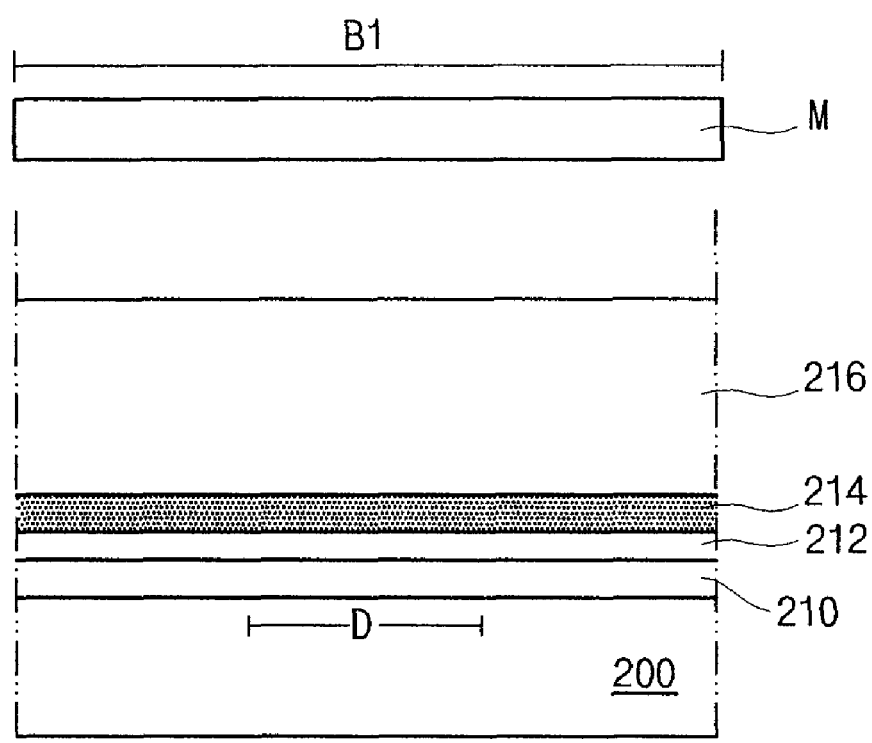

Referring to FIGS. 12B, 13B and 14B, a gate insulating layer 210, an intrinsic amorphous silicon layer 212 and a shielding layer 214 are formed on the substrate 200 having the gate line 204. The gate insulating layer 210 includes an inorganic material, such as silicon nitride (SiNx) and silicon oxide (SiO2). The shielding layer 214 includes an inorganic material, such as silicon nitride (SiNx) and silicon oxide (SiO2). A photoresist layer 216 is formed on the shielding layer 214. For example, the photoresist layer 216 is a positive type.

A mask M having a transmitting portion B1, a semi-transmitting portion B2 and a blocking portion B3 is positioned over the photoresist layer 216. The semi-transmitting portion B2 has a slit structure or semi-transmitting film so that light intensity or transmissivity passing through the semi-transmitting portion B2 can be lower than the transmitting portion B1.

An exposure process is performed for the photoresist layer 216 using the mask M. The blocking portion B3 is disposed in the switching region S, and the semi-transmitting portion B2 is disposed at both sides of the blocking portion B3. The semi-transmitting portion B2 and the blocking portion B3 are disposed in the gate electrode 202. The photoresist layer 216 exposed to light is developed.

Figure 12C:
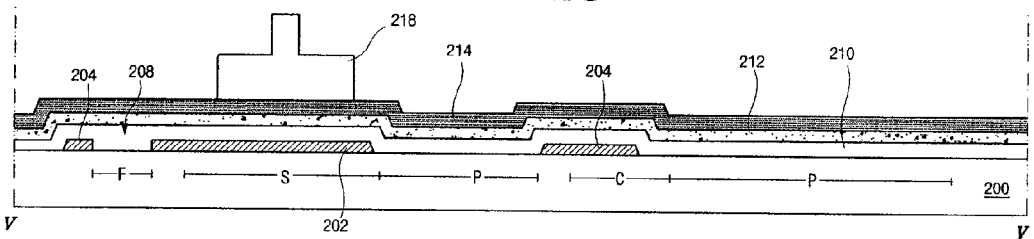
Figure 13C:
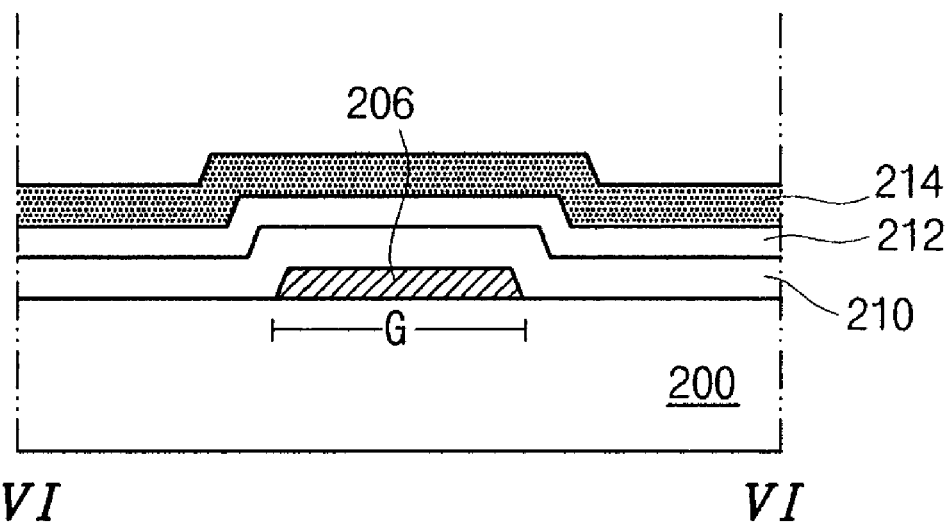
Figure 14C:
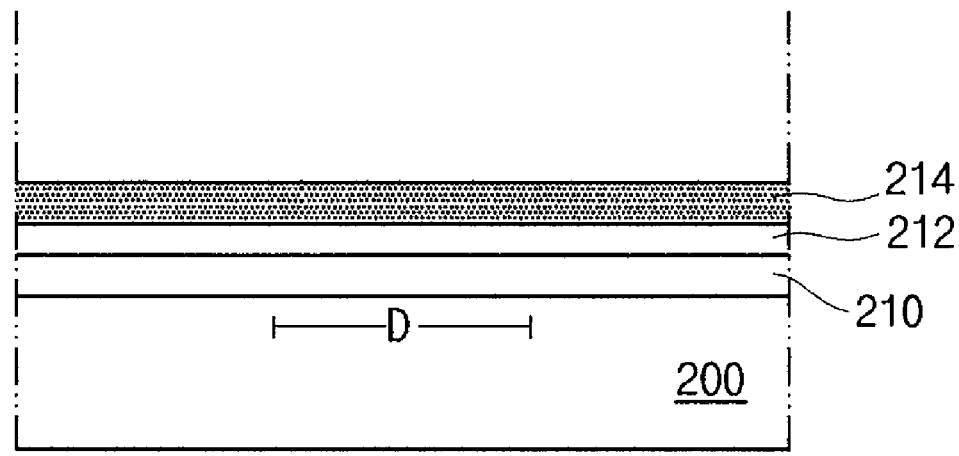

Referring to FIGS. 12C, 13C and 14C, due to the exposure and developing, a photoresist pattern 218 is formed in the switching region S. A portion of the photoresist pattern 218 corresponding to the blocking portion (B3 of FIG. 12B) has a thickness thicker than a portion of the photoresist pattern 218 corresponding to the semi-transmitting portion (B2 of FIG. 12B). The shielding layer 214 and the intrinsic amorphous silicon layer 212 are etched using the photoresist pattern 218.

Figure 12D:
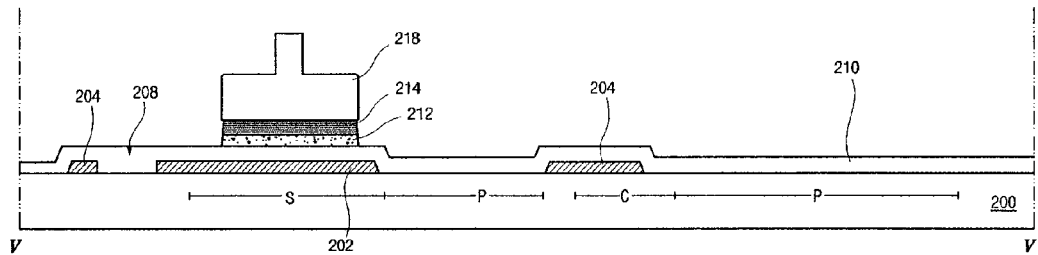
Figure 13D:
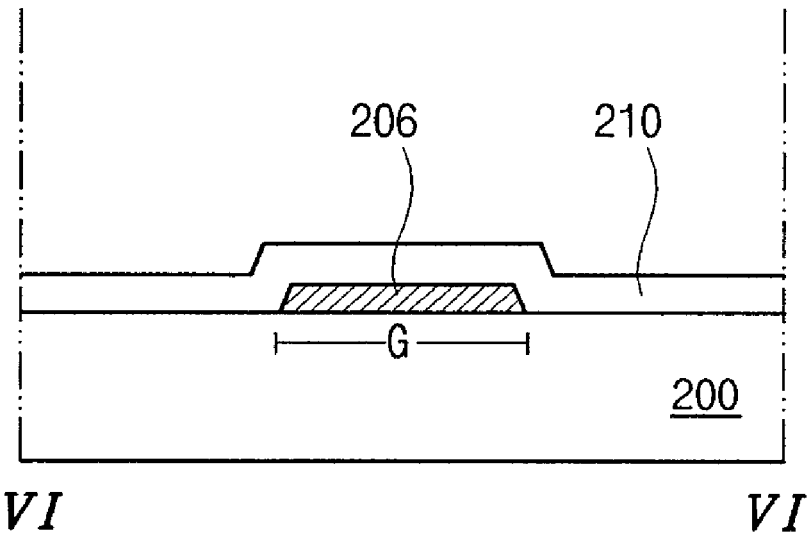
Figure 14D:
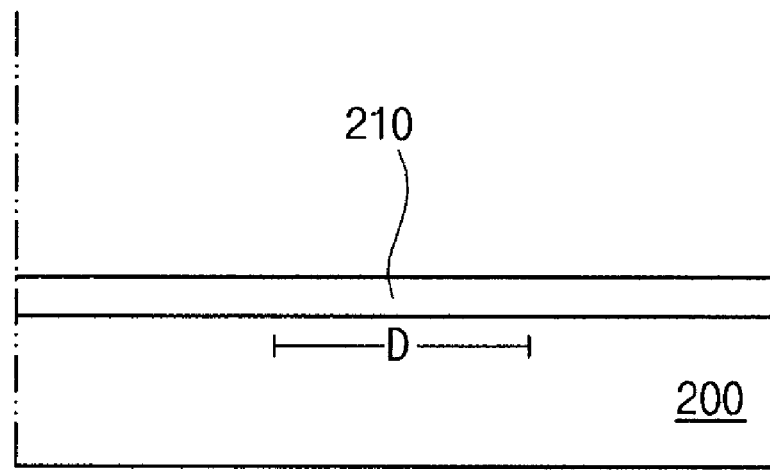

Referring to FIGS. 12D, 13D and 14D, due to the etching, the patterned intrinsic amorphous silicon layer 212 and the shielding layer 214 below the photoresist pattern 218 remain. The intrinsic amorphous silicon layer 212 is within an area defined by the gate electrode 202. An ashing process is performed for the photoresist pattern 218.

Figure 12E:
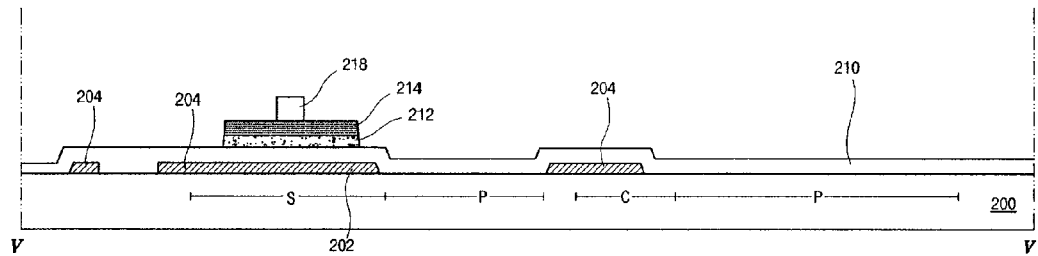
Figure 13E:
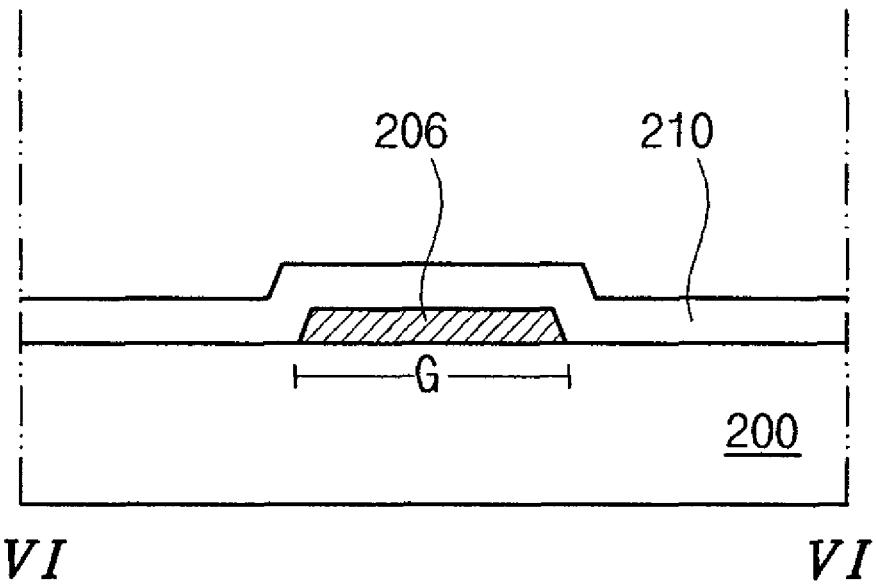
Figure 14E:
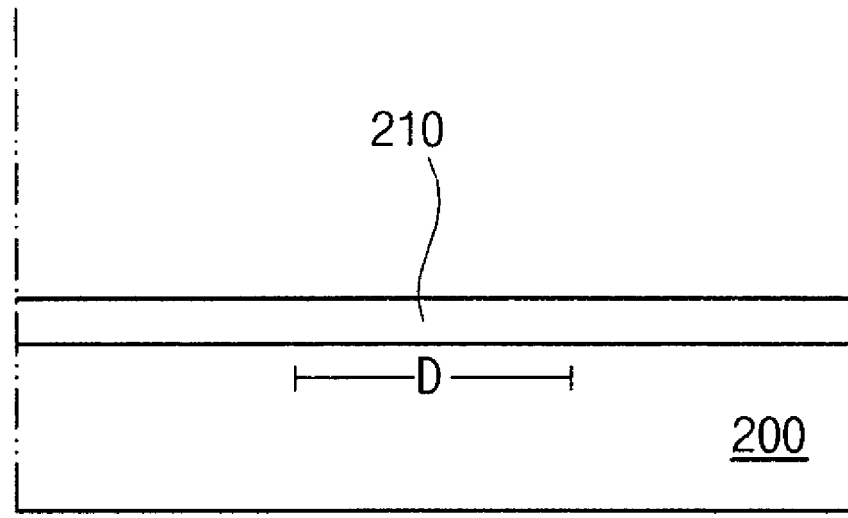

Referring to FIGS. 12E, 13E and 14E, due to the ashing, the portion of the photoresist pattern (212 of FIG. 12D) having the thinner thickness is removed. The shielding layer 214 is etched using the ashed photoresist pattern 212.

Figure 12F:
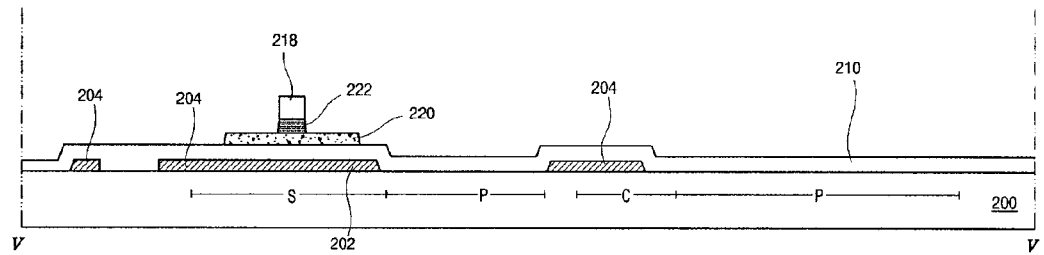
Figure 13F:
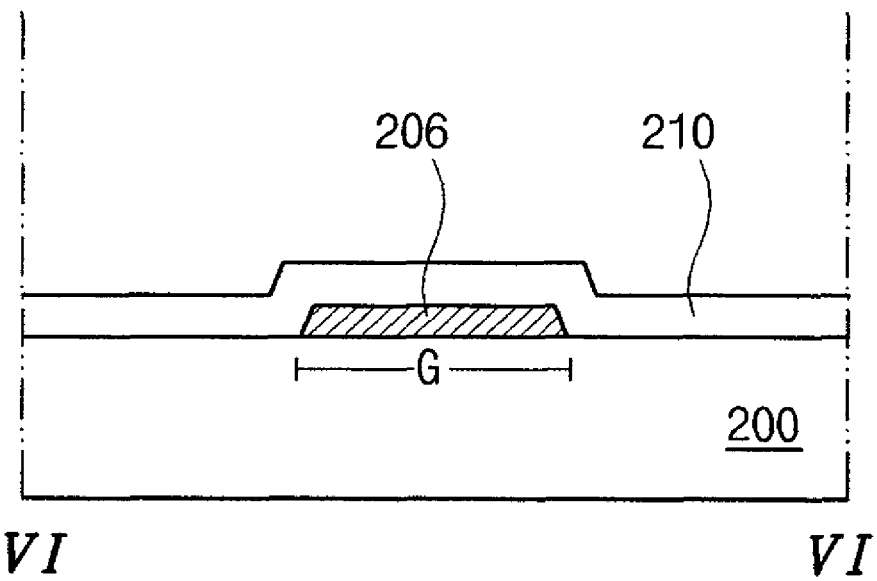
Figure 14F:
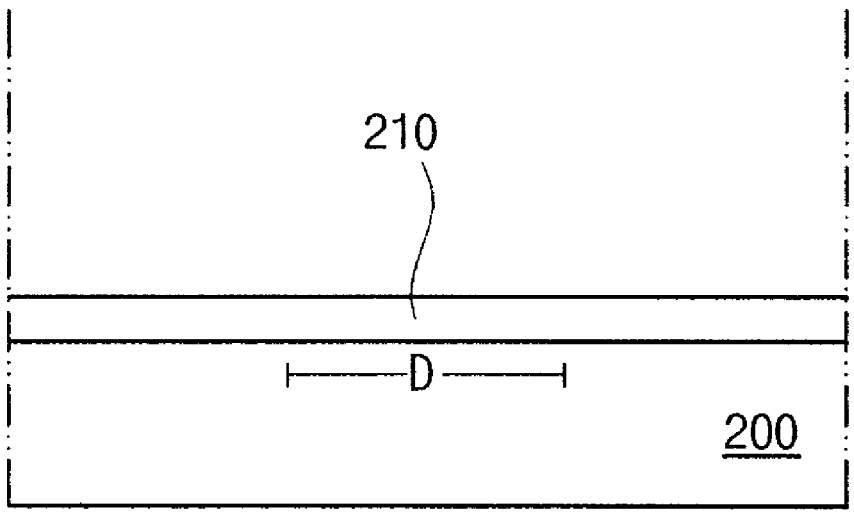

Referring to FIGS. 12F, 13F and 14F, due to the etching, a shielding pattern 222 is formed below the ashed photoresist pattern 212. The intrinsic amorphous silicon layer (212 of FIG. 12E) is referred to as an active layer 220. The shielding pattern 222 can have various shapes, for example, a "U" shape to cross a length of a channel (CH of FIGS. 9 to 11). A number and a position of the shielding pattern 222 may be varied, as shown in FIGS. 10 and 11. The photoresist pattern 218 is then stripped. Through a second mask process shown in FIGS. 12B to 12F, 13B to 13F and 14B to 14F, the active layer 220 and the shielding pattern 222 are formed.

Figure 12G:
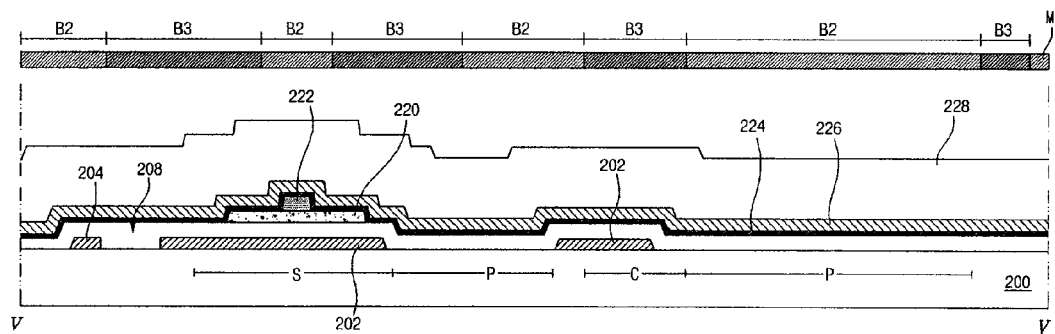
Figure 13G:
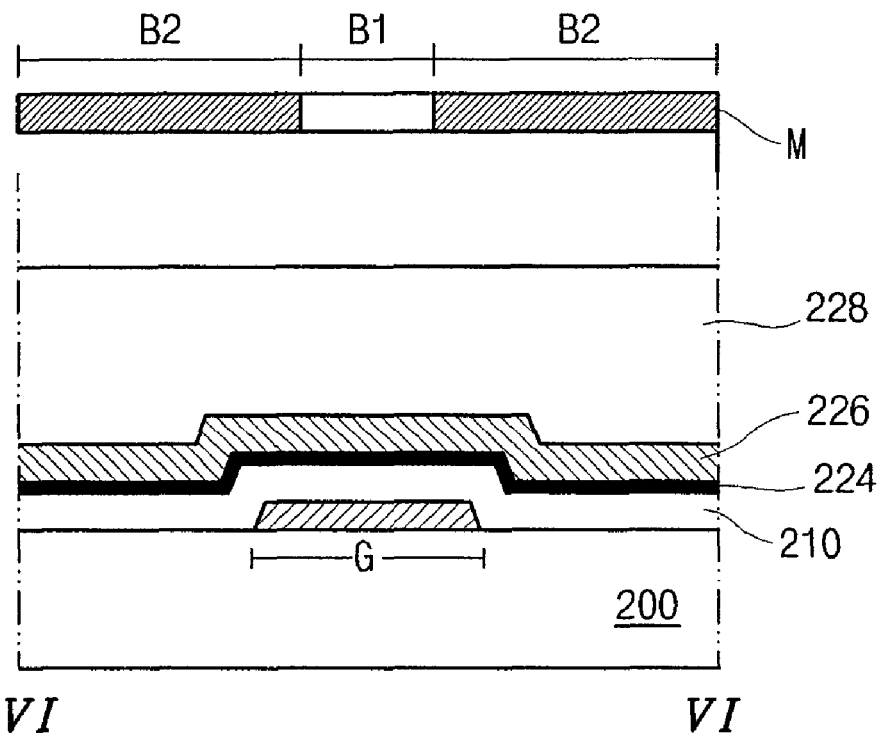
Figure 14G:
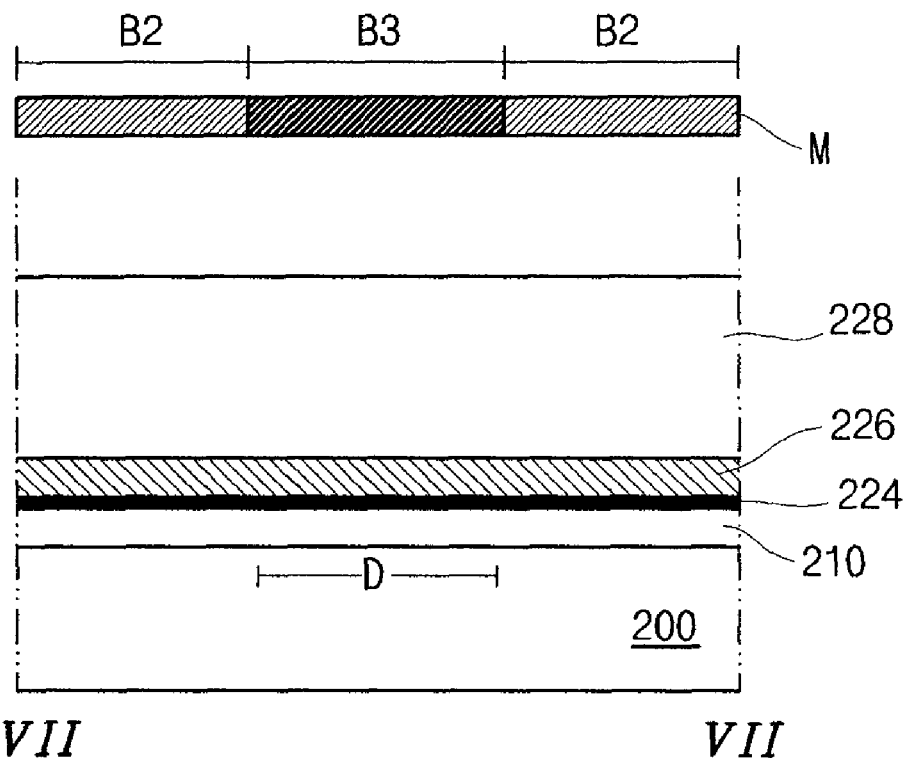

Referring to FIGS. 12G, 13G and 14G, an impurity-doped amorphous silicon layer 224 and a conductive material layer 226 are formed. The conductive material includes aluminum (Al), aluminum alloy (AlNd), tungsten (W), chromium (Cr) and molybdenum (Mo). At least one of the conductive materials may be deposited for single or multiple-layered structure. The impurity-doped amorphous silicon layer 224 does not contact a portion of the active layer 220 below the shielding pattern 222. A photoresist layer 228 is formed on the conductive material layer 226.

A mask M having a transmitting portion B1, a semi-transmitting portion B2 and a blocking portion B3 is over the photoresist layer 228. The semi-transmitting portion B2 has a slit structure or semi-transmitting film.

An exposure process is performed for the photoresist pattern 228 using the mask M. The transmitting portion B1 corresponds to a part of the gate pad electrode 206. The semi-transmitting portion B2 in the switching region S corresponds to a part of the active layer 220. The semi-transmitting portion B2 in the switching region S covers the shielding pattern 222. Alternatively, the semi-transmitting portion B2 in the switching region S may overlap the shielding pattern 222. The blocking portion B3 is disposed at both sides of the semi-transmitting portion B3 in the switching region S. The blocking portion B3 corresponds to the data region D and the storage region C. The semi-transmitting portion B2 also corresponds to the pixel region P. The photoresist layer 228 exposed to light is developed.

Figure 12H:
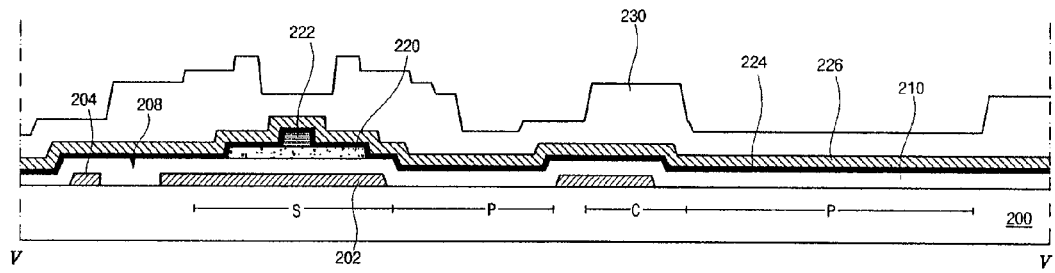
Figure 13H:
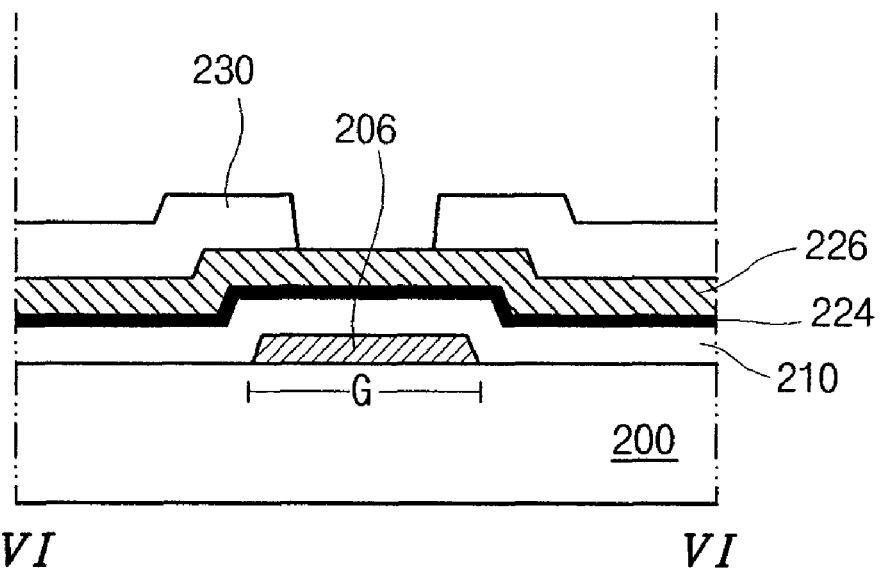
Figure 14H:
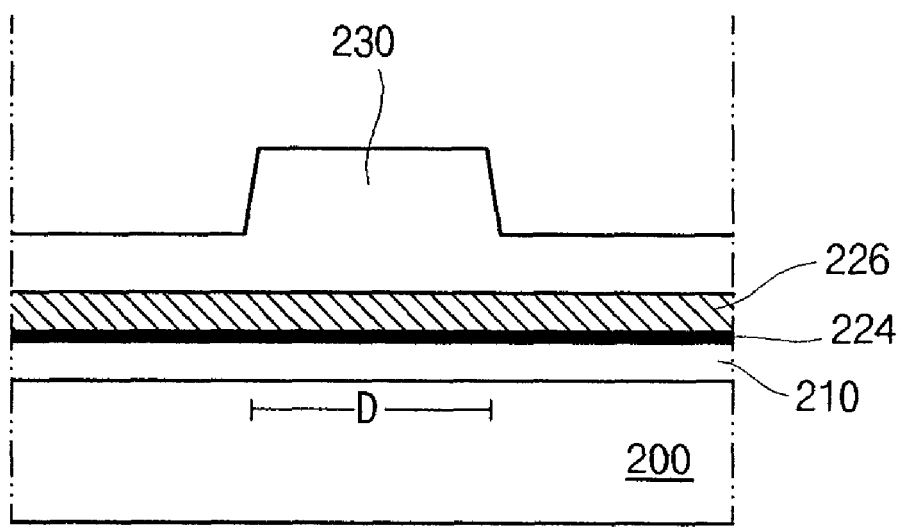

Referring to FIGS. 12H, 13H and 14H, due to the exposure and developing, a photoresist pattern 230 is formed. A portion of the photoresist pattern 230 corresponding to the blocking portion (B3 of FIGS. 12G and 14G) has a thickness thicker than a portion of the photoresist pattern 230 corresponding to the semi-transmitting portion (B2 of FIGS. 12G, 13G and 14G). A portion of the photoresist layer (228 of FIGS. 12G, 13G and 14G) below the transmitting portion (B1 of FIG. 13G) is removed.

Figure 12I:
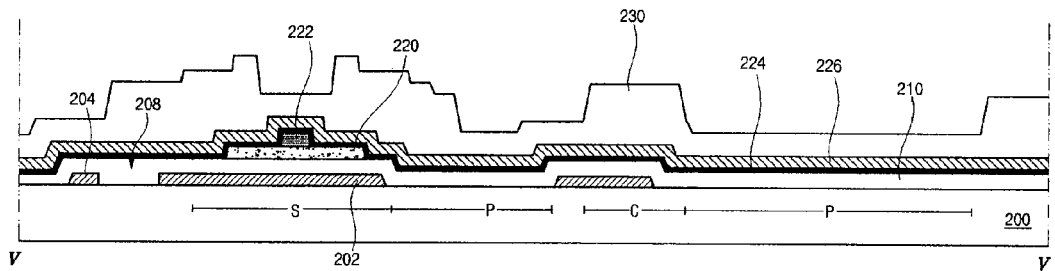
Figure 13I:
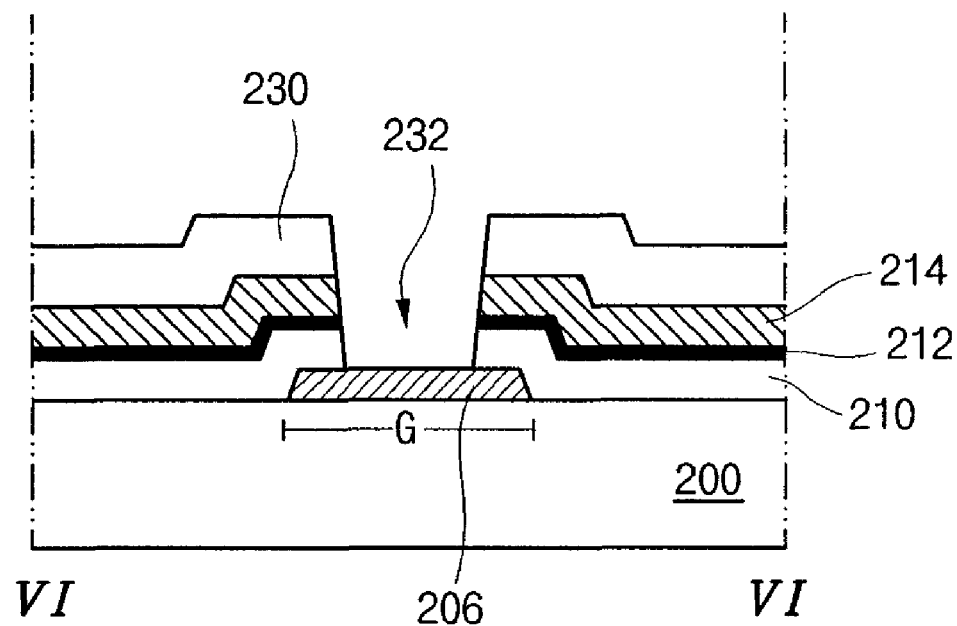
Figure 14I:
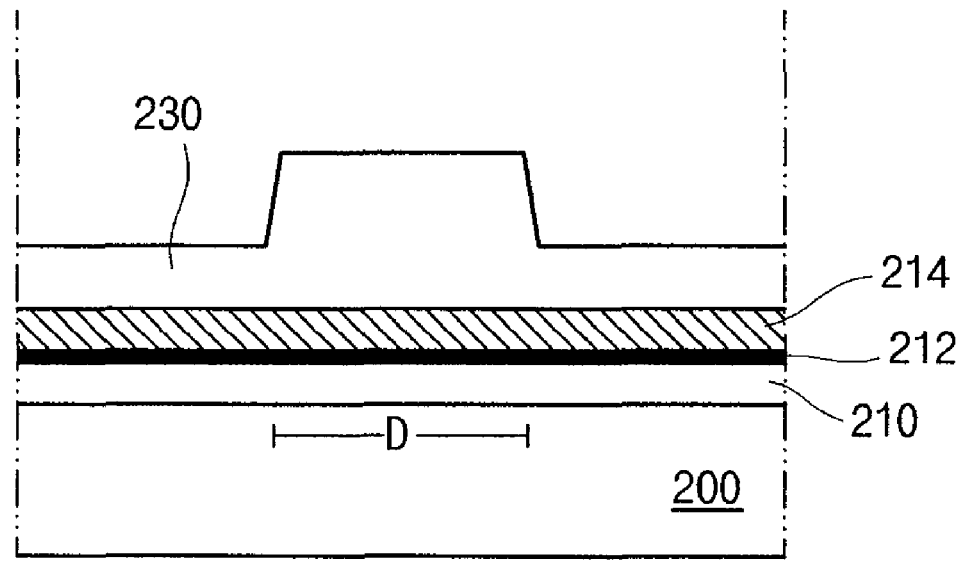

Referring to FIGS. 12I, 13I and 14I, exposed portions of the conductive material layer 226, the impurity-doped amorphous silicon layer 224 and the gate insulating layer over the part of the gate pad electrode 206 is etched using the photoresist pattern 230 to form a gate pad contact hole 206 exposing the part of the gate pad electrode 206. An ashing process is performed for the photoresist pattern 230.

Figure 12J:
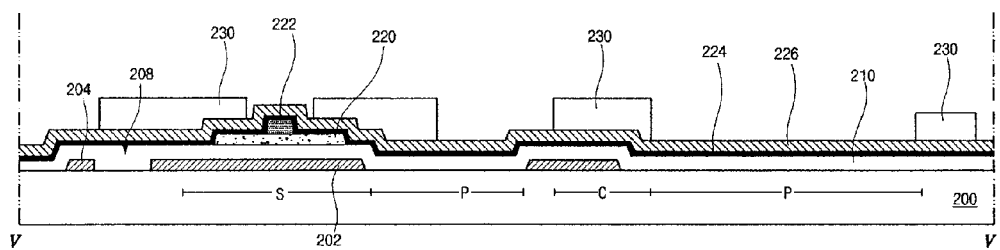
Figure 13J:
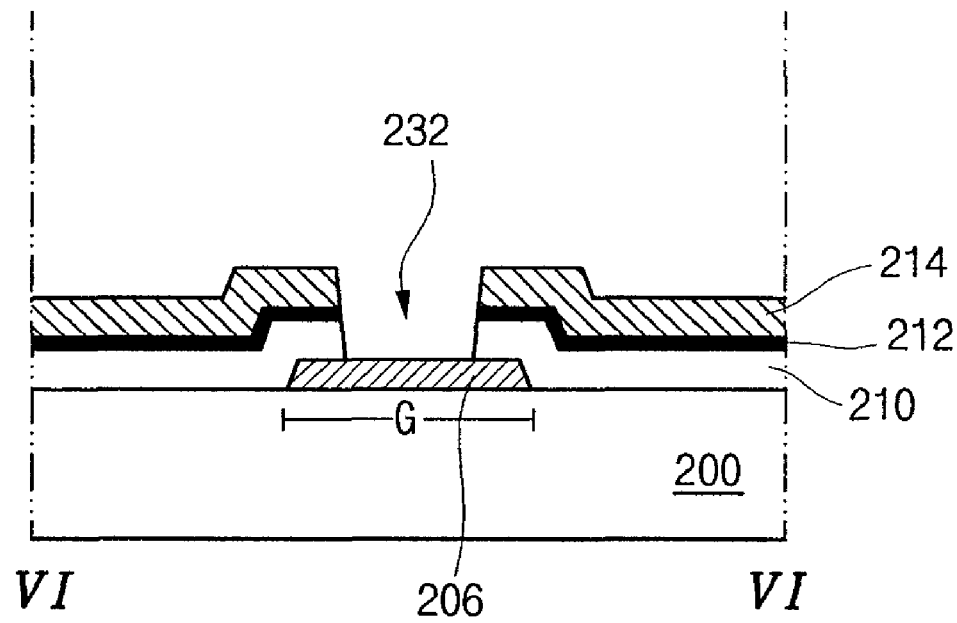
Figure 14J:
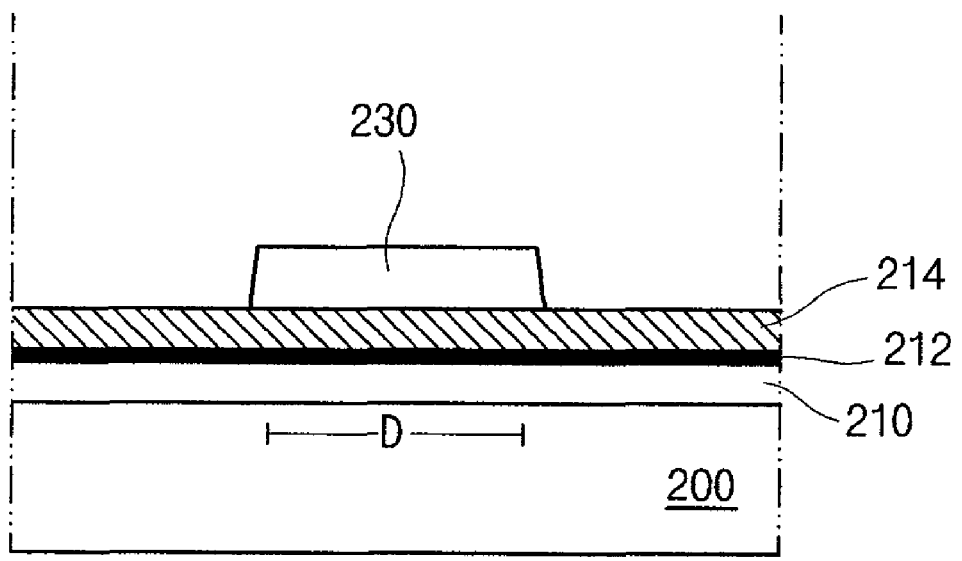

Referring to FIGS. 12J, 13J and 14J, due to the ashing, the portion of the photoresist pattern (230 of FIGS. 12I, 13I and 14I) having the thinner thickness is removed. Accordingly, the ashed photoresist pattern 230 remains corresponding to the switching region S, the storage region C and the data region D. The conductive material layer 226 and the impurity-doped amorphous silicon layer 224 are etched using the ashed photoresist pattern 230.

Figure 12K:
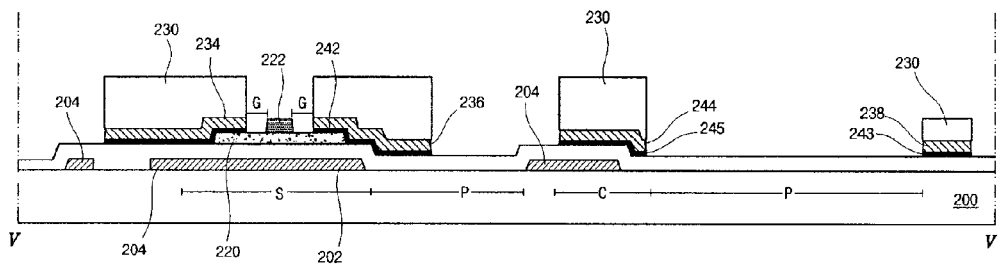
Figure 13K:
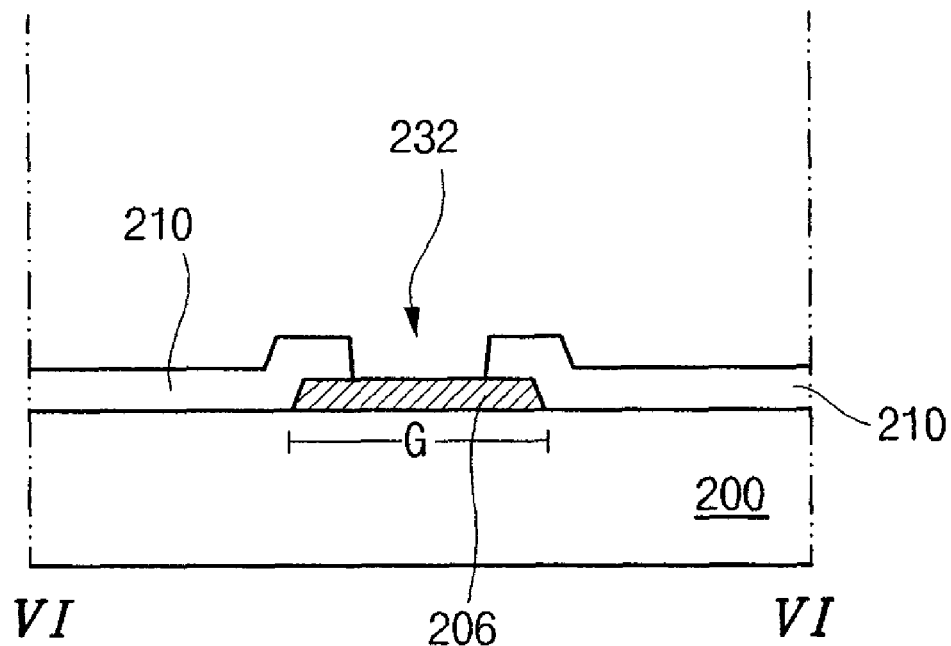
Figure 14K:
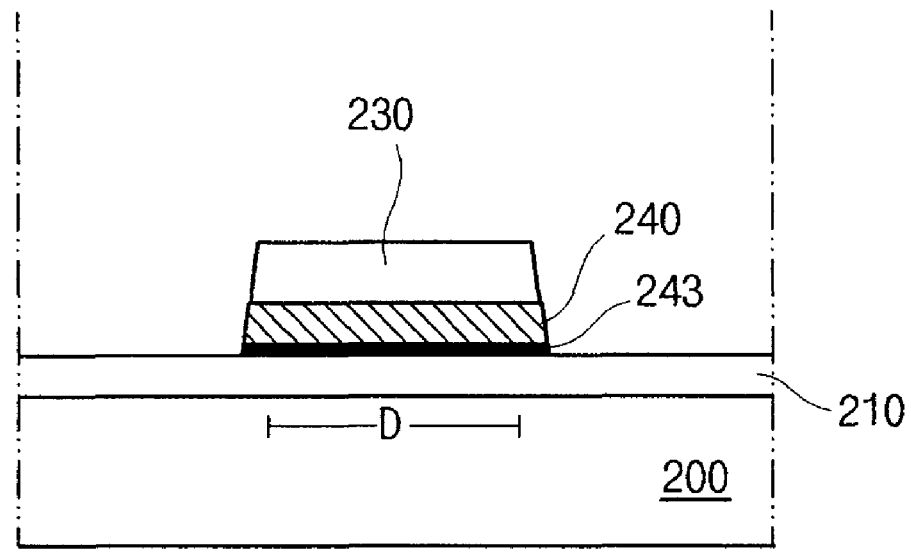

Referring to FIGS. 12K, 13K and 14K, due to the etching, source and drain electrodes 234 and 236 are formed in the switching region S. A storage electrode 244 is formed in the storage region C. A data line 238 and a data pad electrode 240 are formed in the data region D. The patterned impurity-doped amorphous silicon layer below the source and drain electrodes 234 and 236 is referred to as an ohmic contact layer 242. The patterned impurity-doped amorphous silicon layer below the data line 238 and the data pad electrode 240 is referred to as a first semiconductor pattern 243. The patterned impurity-doped amorphous silicon layer below the storage electrode 244 is referred to as a second semiconductor pattern 245.

Through a third mask process shown in FIGS. 12G to 12K, 13G to 13K and 14G and 14K, the source and drain electrodes 234 and 236, the data line 238, the data pad electrode 240, the ohmic contact layer 242, and the first and second semiconductor patterns 243 and 245 are formed. During the third mask process, the active layer 220 may have contamination or defect because residual particles or contamination materials remain on the active layer 220. However, even when an exposed portion G of the active layer 220 may have contamination or defect, a portion of the active layer 222 below the shielding pattern 222 does not have contamination or defect because the shielding pattern 222 shields the portion therebelow. The ashed photoresist pattern 230 is then stripped.

Figure 12L:
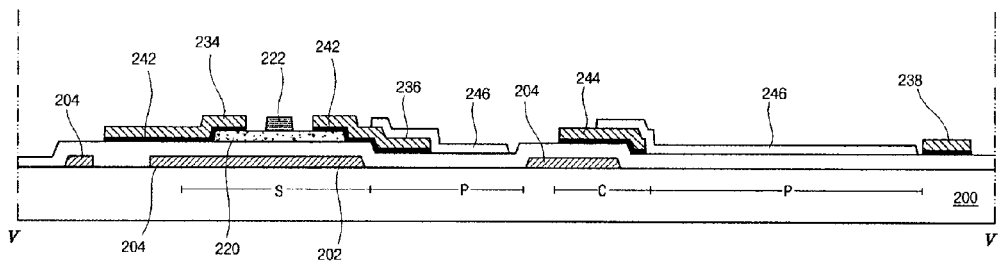
Figure 13L:
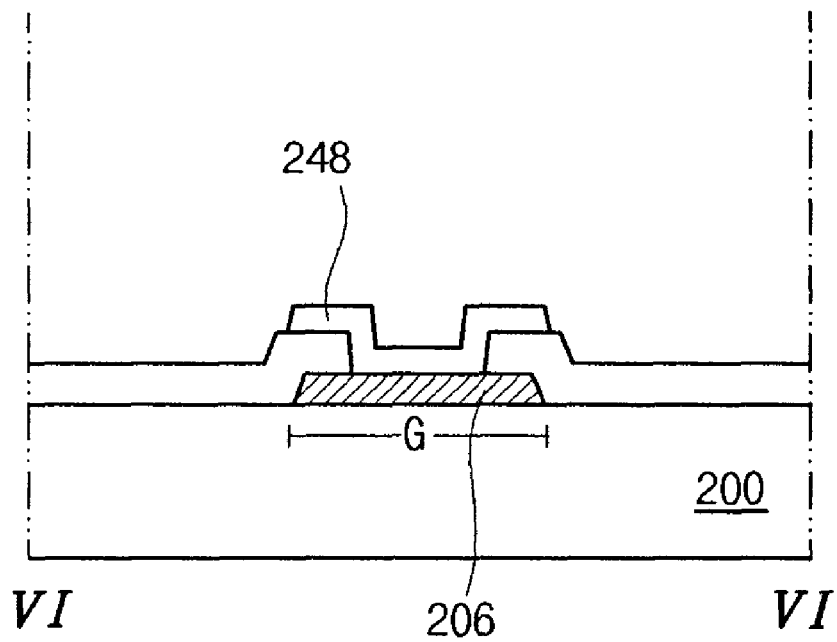
Figure 14L:
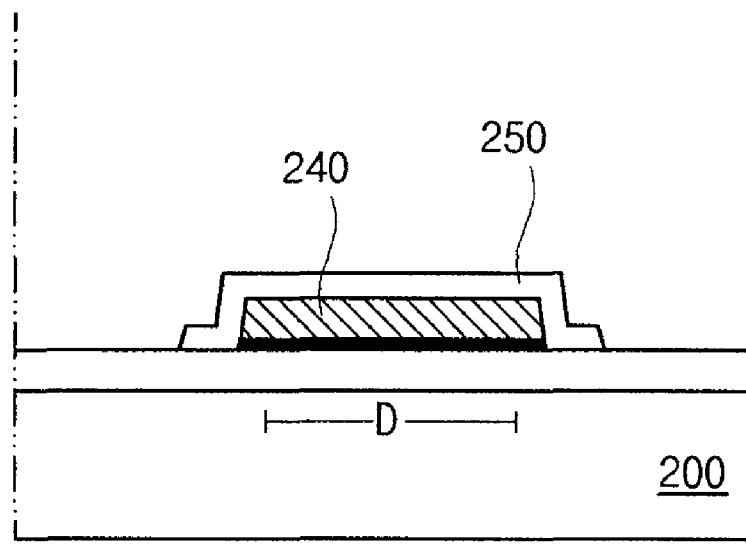

Referring to FIGS. 12L, 13L and 14L, a transparent conductive material is deposited on the substrate 200 having the data line 238 and patterned with a fourth mask process to form a pixel electrode 246, a gate pad electrode terminal 248 and a data pad electrode terminal 250. The pixel electrode 246 is formed in the pixel region P and contacts the drain electrode 236 and the storage electrode 244. The gate pad electrode terminal 248 contacts the gate pad electrode 206 through the gate pad contact hole 232. The data pad electrode terminal 250 contacts the data pad electrode 250. The transparent conductive material includes indium-tin-oxide (ITO), an indium-zinc-oxide (IZO) and indium-tin-zinc-oxide (ITZO).

Through the above-described processes, the array substrate for the LCD device is fabricated. By attaching the array substrate and a substrate opposing the array substrate, for example, a color filter substrate, and interposing a liquid crystal layer between the two substrates, the LCD device is fabricated.

As explained above, because the active layer is within an area defined by the gate electrode, the active layer is not exposed to a backlight. Accordingly, leakage current due to the backlight can be reduced. Even when contamination or defect may be directed at the active layer, the portion of the active layer below the shielding pattern is shielded from contamination or defect, and the shielding pattern is disposed over all current paths of the active layer between the source and drain electrodes. Accordingly, leakage current due to contamination or defect can be reduced so as to improve display quality. Further, because the part of the gate line is used as the gate electrode, the thin film transistor is substantially formed over the gate line such that the aperture ratio is improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
   a gate line and a data line crossing each other to define a pixel region on a substrate;
   a gate electrode connected to the gate line;
   a gate insulating layer on the gate electrode;
   an active layer on the gate insulating layer;
   source and drain electrodes on the active layer, spaced apart from each other and each having inner sides that face each other, wherein the source electrode is connected to the data line;
   ohmic contact layers between the active layer and each of the source and drain electrodes;
   a shielding pattern over the active layer and having outer sides, wherein at least one of the outer sides faces at least one of the inner sides of the source and drain electrodes; and
   a pixel electrode in the pixel region and connected to the drain electrode,
   wherein the source electrode has a "U" shape, the drain electrode has a bar shape, and the shielding pattern has a "U" shape.

2. The device according to claim 1, wherein outer sides of the shielding pattern face the inner sides of the source and drain electrodes.

3. The device according to claim 1, wherein the shielding pattern is overlapped by one of the source and drain electrodes, and the ohmic contact layers.

4. The device according to claim 1, wherein both ends of the shielding pattern are outside the active layer.

5. The device according to claim 1, further comprising another shielding pattern over the active layer and having other outer sides, wherein at least one of the other outer sides faces at least one of the inner sides of the source and drain electrodes.

6. The device according to claim 1, wherein the active layer is within an area defined by the gate electrode.

7. The device according to claim 1, wherein the gate electrode is a part of the gate line.

8. The device according to claim 1, wherein the gate line has a hole at a crossing of the gate and data lines.

9. The device according to claim 1, further comprising a semiconductor pattern below the data line and extending from the ohmic contact layer below the source electrode.

10. The device according to claim 1, further comprising a storage electrode overlapping the gate line and contacting the pixel electrode, and a semiconductor pattern below the storage electrode and of the same material as the ohmic contact layer.

11. The device according to claim 1, wherein the pixel electrode contacts the gate insulating layer in the pixel region.

12. The device according to claim 1, further comprising a gate pad electrode at one end of the gate line and a data pad electrode at one end of the data line.

13. The device according to claim 12, further comprising a gate pad electrode terminal contacting the gate pad electrode through a gate pad contact hole of the gate insulating layer, and a data pad electrode terminal contacting the data pad electrode.

14. The device according to claim 1, wherein the active layer includes intrinsic amorphous silicon, the ohmic contact layer includes impurity-doped amorphous silicon, and the shielding pattern includes an inorganic material.

* * * * *